(12) United States Patent
Sonoda et al.

(10) Patent No.: US 9,076,989 B2
(45) Date of Patent: Jul. 7, 2015

(54) METHOD FOR FORMING DEPOSITION FILM, AND METHOD FOR PRODUCING DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/976,422

(22) PCT Filed: Dec. 20, 2011

(86) PCT No.: PCT/JP2011/079439
§ 371 (c)(1),
(2), (4) Date: Jun. 26, 2013

(87) PCT Pub. No.: WO2012/090770
PCT Pub. Date: Jul. 5, 2012

(65) Prior Publication Data
US 2013/0295705 A1 Nov. 7, 2013

(30) Foreign Application Priority Data

Dec. 27, 2010 (JP) .................. 2010-291202

(51) Int. Cl.
*H01L 51/56* (2006.01)
*H05B 33/04* (2006.01)
(Continued)

(52) U.S. Cl.
CPC .............. *H01L 51/56* (2013.01); *H01L 27/3211* (2013.01); *H05B 33/04* (2013.01); *H05B 33/10* (2013.01); *H01L 21/02104* (2013.01); *H01L 2227/323* (2013.01); *H01L 2251/566* (2013.01); *H01L 51/0011* (2013.01); *C23C 14/042* (2013.01); *C23C 16/042* (2013.01)

(58) Field of Classification Search
CPC ............ H01L 51/0011; H01L 27/3283; H01L 51/0008; H01L 21/02104; H01L 51/5012; H01L 27/3202; H01L 27/322; H01L 27/3295; H01L 51/0002; H01L 51/001; H01L 27/3225; H01L 2924/12044
See application file for complete search history.

(56) References Cited

U.S. PATENT DOCUMENTS 4,420,365 A * 12/1983 Lehrer ......................... 438/702
5,742,129 A * 4/1998 Nagayama et al. ........... 315/167
(Continued)

FOREIGN PATENT DOCUMENTS

JP  8-227276 A   9/1996
JP  10-102237 A  4/1998
(Continued)

OTHER PUBLICATIONS

International Search Report received for PCT Patent Application No. PCT/JP2011/079439, mailed on Feb. 7, 2012, 2 pages (2 pages of English Translation and 2 pages of Official copy).
(Continued)

*Primary Examiner* — Bac Au
(74) *Attorney, Agent, or Firm* — Morrison & Foerster LLP

(57) ABSTRACT

A masking film (13) is formed so as to have an opening in a display region (R1) (luminescent region) and a sealing region. Subsequently, luminescent layers (8R, 8G, and 8B) having a stripe pattern are formed. Then, the masking film (13) is peeled off, so that the luminescent layers (8R, 8G, and 8B) patterned with high resolution are provided.

20 Claims, 21 Drawing Sheets

(51) Int. Cl.
*H05B 33/10* (2006.01)
*H01L 21/02* (2006.01)
*H01L 51/00* (2006.01)
*C23C 14/04* (2006.01)
*C23C 16/04* (2006.01)
*H01L 27/32* (2006.01)

(56) References Cited

U.S. PATENT DOCUMENTS

| | | |
|---|---|---|
| 6,294,892 B1 | 9/2001 | Utsugi et al. |
| 6,378,199 B1 * | 4/2002 | Yoshinuma et al. ............ 29/830 |
| 6,410,445 B1 | 6/2002 | Fägerman |
| 7,598,668 B2 * | 10/2009 | Oyamada et al. ............. 313/504 |
| 2006/0011136 A1 | 1/2006 | Yamazaki et al. |
| 2006/0228477 A1 * | 10/2006 | Zhang et al. ............... 427/249.1 |
| 2008/0024873 A1 * | 1/2008 | Kim et al. ..................... 359/642 |
| 2009/0136877 A1 | 5/2009 | Suganuma |
| 2009/0184636 A1 | 7/2009 | Cok |

FOREIGN PATENT DOCUMENTS

| | | |
|---|---|---|
| JP | 10-261486 A | 9/1998 |
| JP | 2000-164353 A | 6/2000 |
| JP | 2000-188179 A | 7/2000 |
| JP | 2001-118679 A | 4/2001 |
| JP | 2002-367774 A | 12/2002 |
| JP | 2006-317762 A | 11/2006 |
| JP | 2010-108706 A | 5/2010 |

OTHER PUBLICATIONS

International Search Report received for PCT Patent Application No. PCT/JP2011/079441, mailed on Feb. 7, 2012, 5 pages (2 pages of English Translation and 3 pages of Search Report).

International Preliminary Report on Patentability received for PCT Patent Application No. PCT/JP2011/079441, mailed on Jul. 11, 2013, 12 pages (7 pages of English Translation and 5 pages of IPRP).

International Preliminary Report on Patentability received for PCT Patent Application No. PCT/JP2011/079439, mailed on Jul. 11, 2013, 14 pages (8 pages English Translation and 6 pages IPRP).

Non Final Office Action received for U. S. Appl. No. 13/976,437, mailed on Jun. 24, 2014, 10 pages.

* cited by examiner

METHOD FOR FORMING DEPOSITION FILM, AND METHOD FOR PRODUCING DISPLAY DEVICE

CROSS REFERENCE TO RELATED APPLICATIONS

This is a U.S. National Phase patent application of PCT/JP2011/079439, filed Dec. 20, 2011, which claims priority to Japanese patent application no. 2010-291202, filed Dec. 27, 2010, each of which is hereby incorporated by reference in the present disclosure in its entirety.

TECHNICAL FIELD

The present invention relates to a method for forming a vapor-deposited film which is patterned into a predetermined shape; and a method for manufacturing a display device which includes the vapor-deposited film patterned into the predetermined shape.

BACKGROUND ART

In recent years, flat panel displays are utilized in various products and fields. The flat panel displays are expected to have a further increased size, a further enhanced image quality, and further reduced electric power consumption.

In this situation, organic EL display devices, which include an organic EL element which utilizes electroluminescence (hereinafter referred to as "EL") of an organic material, have been attracting much attention as all-solid-state flat panel displays having excellent properties in terms of low voltage driving, fast response characteristic, self-light emission property, wide viewing angle characteristic, and the like.

An organic EL display device has a configuration in which, for example, an organic EL element is provided on a substrate, which is constituted by a glass substrate or the like and is provided with a TFT (thin-film transistor), and the organic EL element is electrically connected with the TFT.

For example, a full-color organic EL display device is in general arranged such that organic EL elements including luminescent layers of respective colors red (R), green (G), blue (B) are provided in array on a substrate as subpixels, and a color image is displayed by using TFTs so as to selectively cause the organic EL elements to emit light with desired luminances.

As such, in order to manufacture an organic EL display device, luminescent layers made from organic light-emitting materials, which emit light of respective different colors, need to be formed, in a predetermined pattern, for respective organic EL elements.

As a method for forming such luminescent layers in a predetermined pattern, for example, vacuum deposition, ink-jet printing, the laser transfer method, and the like have been known. For example, in a low molecular organic EL display device (OLED), vacuum deposition is used in many cases.

In vacuum deposition, a mask (also called shadow mask) having an opening of a predetermined pattern is used, and a substrate, with which the mask is in close contact and to which the mask is fixed, is arranged so that a vapor-deposited surface of the substrate faces a vapor deposition source.

Then, deposition particles (a material for film formation) supplied from the vapor deposition source are deposited on the vapor-deposited surface through the opening of the mask, so that a thin film having the predetermined pattern is formed. The deposition is carried out with respect to each color of the luminescent layers, and this is called "selective vapor deposition".

Patent Literatures 1 and 2 each describe a method of carrying out selective vapor depositions of luminescent layers of respective colors by gradually moving a mask with respect to a substrate.

In such a conventional selective vapor deposition method, a mask that is equal in size to a substrate is used. When the deposition is carried out, the mask is fixed to the substrate so as to cover a vapor-deposited surface of the substrate.

It is therefore necessary in the conventional selective vapor deposition method to enlarge the mask as the substrate is made larger.

However, in a case where the mask is enlarged, a gap between the substrate and the mask is more easily formed by self-weight bending and extension the mask. Moreover, a size of the gap varies depending on a position of the gap on the vapor-deposited surface of the substrate.

This creates a problem that high-precision patterning is not easily carried out by the conventional selective vapor deposition method, so that displacements of a vapor deposition position and color mixture occur.

Further, in the conventional selective vapor deposition method, enlarging the mask results in causing a frame or the like for holding the mask to become enormous and have an increased weight as well. This may result in more difficult handling and deteriorated productivity and safety.

Moreover, in the conventional selective vapor deposition method, a vapor deposition device and a device accompanying the vapor deposition device are also made enormous and complicated. This results in difficulty in designing the devices and an increased installation cost.

As described above, it is difficult by the conventional selective vapor deposition method to form a high-resolution patterned vapor-deposited film on a large substrate. Currently, on a large substrate for which a mask of, for example, 60 in. or larger is used, the selective vapor deposition has not been successfully carried out on a large scale for mass production.

CITATION LIST

Patent Literatures

Patent Literature 1
Japanese Patent Application Publication, Tokukaihei, No. 8-227276 A (Publication Date: Sep. 3, 1996)
Patent Literature 2
Japanese Patent Application Publication, Tokukai, No. 2000-188179 A (Publication Date: Jul. 4, 2000)

SUMMARY OF INVENTION

Technical Problem

In view of the above, there has been proposed a selective vapor deposition method in which a shadow mask 102 smaller than a substrate 101 is used as illustrated in FIGS. 14 and 15.

The selective vapor deposition method employs a mask unit 105 which is constituted by (i) the shadow mask 102 having an opening 102a, (ii) a nozzle 103 having a nozzle opening 103a, and (iii) a vapor deposition material supply source connected with the nozzle 103. The shadow mask 102, the nozzle 103, and the vapor deposition material supply source are integrally formed.

As illustrated in FIG. 14, in a state where (i) a vapor-deposited surface 101a of the substrate 101 and the shadow mask 102 face each other and (ii) a gap G between the vapor-deposited surface 101a and the shadow mask 102 is maintained constant, deposition is carried out while the substrate 101 is scanned over the mask unit 105, which is fixed, to the right and left as viewed in FIG. 14. This allows a vapor-deposited film having a stripe pattern to be formed on the vapor-deposited surface 101a of the substrate 101.

Alternatively, in the selective deposition method, the vapor-deposited film having the strip pattern can be formed on the vapor-deposited surface 101a of the substrate 101 also by, as illustrated in FIG. 15, fixing the substrate 101 and carrying out deposition while scanning the mask unit 105 over the substrate 101, which is fixed, to the right and left as viewed in FIG. 15.

The selective vapor deposition method employing such a scanning technique does not require a mask of an equal size as that of the substrate, unlike the conventional selective vapor deposition method. This makes it possible to improve the above-described problems that may be caused by an increase in size of a mask.

However, in the selective vapor deposition method employing the scanning technique in which the shadow mask 102 smaller than the substrate 101 is used, a problem as described below newly arises.

FIG. 16 is a view illustrating the vapor-deposited surface 101a of the substrate 101. The substrate 101, which is large, has a vapor deposition region R1, in which a vapor-deposited film (e.g., a luminescent layer or the like) needs to be formed in each organic EL display device, and a vapor deposition-unnecessary region R2, which serves as a terminal section or the like and in which no vapor-deposited film (e.g., luminescent layer or the like) needs to be formed in each organic EL display device.

Originally, it is not necessary to form a vapor-deposited film (e.g., a luminescent layer or the like) in the vapor deposition-unnecessary region R2. However, in the selective vapor deposition method employing the scanning technique illustrated in FIGS. 14 and 15, a vapor-deposited film 106 having a stripe pattern is formed not only in the vapor deposition region R1 but also in the vapor deposition-unnecessary region R2, as illustrated in FIG. 16.

The following description will explain, with reference to FIG. 17, the reason why the vapor-deposited film 106 having the stripe pattern is formed in the vapor deposition-unnecessary region R2 as well.

As illustrated in FIG. 17, in order to prevent formation of the vapor-deposited film 106 in the vapor deposition-unnecessary region R2 in the selective vapor deposition method employing the scanning technique, the shadow mask 102 may be designed such that, when the shadow mask 102 reaches a vapor deposition OFF line (i.e., when a right edge of the shadow mask 102 reaches a left edge of the vapor deposition-unnecessary region R2), deposition particles to be injected from the nozzle opening of the nozzle of the mask unit are not injected.

However, although this makes it possible to prevent formation of the vapor-deposited film 106 in the vapor deposition-unnecessary region R2, a region in which the shadow mask 102 still remains in the vapor deposition region R1 has a substantially shorter deposition time and, accordingly, becomes a vapor deposition amount-reduced region in which the vapor-deposited film has a reduced film thickness.

As such, in order to form a vapor-deposited film 106 having a uniform film thickness in the vapor deposition region R1 in the selective vapor deposition method employing the scanning technique, there is no option but to form a vapor-deposited film 106, which has a stripe pattern, not only in the vapor deposition region R1 but also in the vapor deposition-unnecessary region R2 as illustrated in FIG. 16.

FIG. 18 is a view for describing problems which may be caused by a vapor-deposited film 106 formed in a vapor deposition-unnecessary region R2.

(a) of FIG. 18 is a view schematically illustrating a configuration of an organic EL display device 113 including, as a luminescent layer, a vapor-deposited film 106 formed by the selective vapor deposition method employing the scanning technique.

(b) of FIG. 18 is a plan view illustrating a terminal section 107a of the organic EL display device 113.

On the substrate 101 included in the organic EL display device 113 illustrated in (a) of FIG. 18, the vapor-deposited film 106 having a stripe pattern is formed not only in a vapor deposition region R1 but also in a vapor deposition-unnecessary region R2.

That is, as illustrated in (b) of FIG. 18, the vapor-deposited film 106 is formed also at the terminal section 107a of a wire 107, which is a vapor deposition-unnecessary region R2.

An external circuit and the terminal section 107a of the wire 107, which is provided in the vapor deposition-unnecessary region R2, are electrically connected with a flexible cable 112 or the like via an anisotropic conductive film (ACF) 111. At this time, the configuration in which the vapor-deposited film 106 is provided on the terminal section 107a as illustrated in (a) of FIG. 18 may cause a defective electric conduction or a leak electric current.

That is, in a case where the vapor-deposited film 106 is a highly-resistive film like an organic vapor-deposited film of a luminescent layer or the like, a defective electric conduction occurs. On the other hand, in a case where the vapor-deposited film 106 is a poorly-resistive film like a metal film, a leak electric current occurs.

In vapor deposition-unnecessary regions R2 in end sections at four sides of the vapor deposition region R1, a sealing resin 109 is provided in a frame shape. The substrate 101 and a sealing substrate 110 are attached to each other via the sealing resin 109.

This makes it possible to prevent an organic EL element, which is constituted by stacking in order (i) an anode (not shown), (ii) a hole-injection layer also serving as a hole-transport layer (not shown), (iii) the vapor-deposited film 106 serving as a luminescent layer, (iv) an electron-transport layer (not shown), (v) an electron-injection layer (not shown), and (vi) a cathode 108, from being deteriorated by moisture and oxygen in the atmosphere.

However, in a case where the vapor-deposited film 106 is interposed between the sealing resin 109 and the substrate 101, adhesion between the sealing resin 109 and the substrate 101 is decreased and/or a hole is formed between the sealing resin 109 and the substrate 101.

As such, there is a possibility that the organic EL element is deteriorated by moisture and oxygen from outside which are infiltrated into an inside of the sealing resin in the frame shape through (i) a part where the adhesion is low or the hole is formed or (ii) the vapor-deposited film 106.

In order to solve the problems, a vapor-deposited film 106 formed in the vapor deposition-unnecessary regions R2 may be wiped off by use of an organic solvent before the substrate 101 and the sealing substrate 110 are attached to each other. However, since the organic EL element is deteriorated by the organic solvent or moisture or oxygen in the atmosphere, in general, the vapor-deposited film 106 formed in the vapor deposition-unnecessary regions R2 is wiped off by use of the organic solvent after (i) the substrate 101 and the sealing substrate 111 are attached to each other and (ii) the substrate 101 is divided into organic EL display devices 113.

However, even in a case where the vapor-deposited film 106 formed in the vapor deposition-unnecessary regions R2 is wiped off by use of the organic solvent after the substrate 101 and the sealing substrate 111 are attached to each other, there arise problems as follows.

One problem is that a loose connection with the external circuit occurs more easily because, in a wiping-off step as described above, there tend to be (i) remnants which are left by insufficient wiping and (ii) foreign matters newly mounted at the time of wiping.

Another problem is that, in a case where the substrate 101 and the sealing substrate 110 are attached to each other via the sealing resin 109, the organic solvent causes damage to the sealing resin 109, so that moisture and oxygen in the atmosphere are more easily infiltrated through a part of the sealing resin 109 where the sealing resin 109 is damaged by the organic solvent.

Accordingly, for example, an organic EL display device manufactured by a manufacture method including the wiping-off step has a low yield, and it is difficult to ensure reliability of the organic EL display device.

The present invention is accomplished in view of the above problems. An object of the present invention is to provide a method for forming a vapor-deposited film that can be patterned with high resolution; and a method for manufacturing a display device having an improved yield and an improved reliability.

Solution to Problem

In order to attain the object, a vapor-deposited film forming method of the present invention is a method for forming a vapor-deposited film on a substrate, including the steps of: forming, in a predetermined region of the substrate, a shielding film that can be peeled off; forming a vapor-deposited film on the substrate via the shielding film; and forming the vapor-deposited film into a predetermined shape by peeling off the shielding film.

According to the method, after a shielding film that can be peeled off is formed in a predetermined region of the substrate, a high-resolution vapor-deposited film is relatively easily formed on the substrate via the shielding film, and then the shielding film is peeled off, so that the vapor-deposited film can be patterned into a predetermined shape with high resolution.

Therefore, the method enables high-resolution patterning.

Further, since the shielding film is peeled off after the vapor-deposited film is formed on the substrate via the shielding film, it is possible to prevent the vapor-deposited film from being formed in a region in which the shielding film is provided.

In order to attain the object, a display device manufacturing method of the present invention is a method for manufacturing a display device, including the steps of: forming a plurality of active elements on a substrate; forming a first electrode in matrix in a display region on the substrate so that the first electrode is electrically connected with each of the plurality of active elements; forming, on the first electrode, an organic layer including at least a luminescent layer; and forming, at least on the organic layer, a second electrode having a reverse polarity to that of the first electrode, wherein: in a step of forming at least the luminescent layer in the organic layer, (i) a shielding film which can be peeled off is formed so as not to cover the display region but cover at least a part of a non-display region, which is a peripheral region of the display region and (ii) at least the luminescent layer, which has a shape of a plurality of straight lines having a predetermined gap between each other, is formed on the substrate via the shielding film so as to extend along a row direction or a column direction of the first electrode formed in matrix; and after the step of forming at least the luminescent layer in the organic layer or after the step of forming the second electrode, the shielding film is peeled off, so that at least the luminescent layer is formed into a predetermined shape.

According to the method, it is possible to realize a method for manufacturing a display device having an improved yield and an improved reliability.

Advantageous Effects of Invention

A vapor-deposited film forming method of the present invention is, as described above, a method including the steps of: forming, in a predetermined region of the substrate, a shielding film that can be peeled off; forming a vapor-deposited film, which has a shape of a plurality of straight lines having a predetermined gap between each other, on the substrate via the shielding film so that the vapor-deposited film extends along a predetermined direction; and forming the vapor-deposited film into a predetermined shape by peeling off the shielding film.

A display device manufacturing method of the present invention is, as described above, a method in which, in a step of forming at least the luminescent layer in the organic layer, (i) a shielding film which can be peeled off is formed so as not to cover the display region but cover at least a part of a non-display region, which is a peripheral region of the display region and (ii) at least the luminescent layer, which has a shape of a plurality of straight lines having a predetermined gap between each other, is formed on the substrate via the shielding film so as to extend along a row direction or a column direction of the first electrode formed in matrix; and after the step of forming at least the luminescent layer in the organic layer or after the step of forming the second electrode, the shielding film is peeled off, so that at least the luminescent layer is formed into a predetermined shape.

Therefore, it is possible to realize a method for forming a vapor-deposited film that can be patterned with high-resolution; and a method for manufacturing a display device having an improved yield and an improved reliability.

DESCRIPTION OF EMBODIMENTS

Embodiments of the present invention will be described below in detail with reference to the drawings. Note that size, material, shape, and the way of arrangement of each member described in the present embodiments are merely examples, and therefore the spirit and scope of the invention should not be limited by these embodiments.

In the following embodiment, a method for manufacturing an organic EL display device will be discussed as an example of cases where a method for forming a vapor-deposited film that can be patterned with high resolution is used. Note, however, that the present invention is not limited to this. A vapor-deposited film forming method of the present invention can be applied to any field in which a high-resolution patterned vapor-deposited film is required.

Further, since the following embodiment is described based on the example of the method for manufacturing an organic EL display device, a vapor-deposited film formed by the vapor-deposited film preparation method of the present invention is exemplified as an organic film. Note, however, that the present invention is not limited to this. As a matter of course, the vapor-deposited film preparation method of the present invention can be applied to preparation of an inorganic film as well.

Embodiment 1

Figure 13:
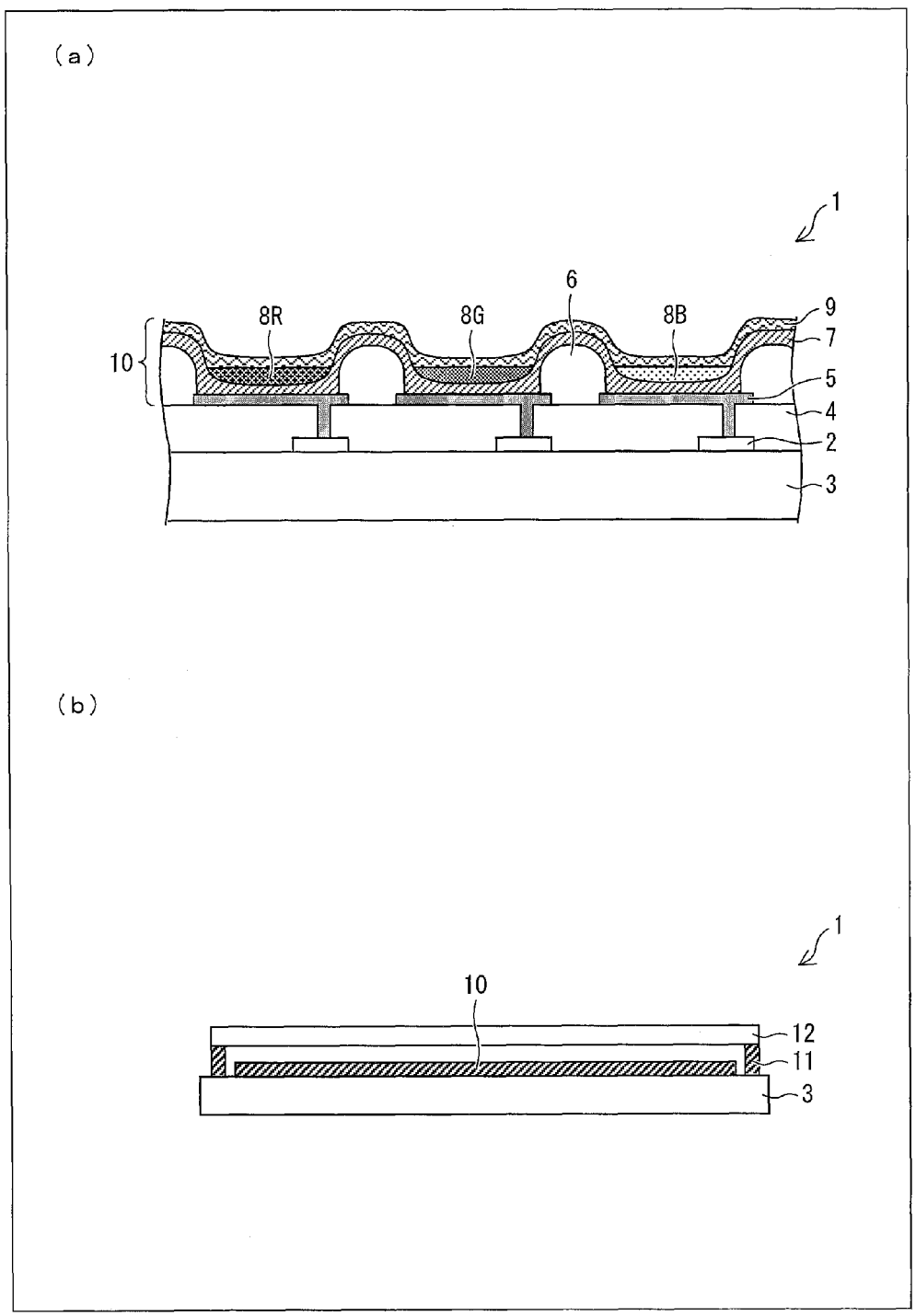
FIG. 13 is a view schematically illustrating a configuration of an organic EL display device manufactured by an organic EL display device manufacturing method of Embodiment 3 of the present invention.

FIG. 13 is a view schematically illustrating a configuration of an organic EL display device 1. (a) of FIG. 13 illustrates a cross-section of an organic EL element 10 constituting a display region of the organic EL display device 1.

An interlayer insulating film 4, a first electrode 5, and an edge cover 6 are provided on a substrate 3, on which a thin-film transistor 2 (hereinafter referred to as "TFT") is provided.

The substrate 3 can be made of, for example, non-alkali glass, plastic, or the like. In the present embodiment, the substrate 3 is made of non-alkali glass with a board thickness of 0.7 mm.

The interlayer insulating film 4 and the edge cover 6 can each be made of a known photosensitive resin, examples of which include an acrylic resin, a polyimide resin, and the like.

In the present embodiment, the interlayer insulating film 4 and the edge cover 6 are each made of a photosensitive acrylic resin.

The first electrode 5 is formed in such a manner that an electrode material is formed by sputtering or the like and then patterned for each pixel by a photolithographic technique and etching.

The first electrode 5 can be made of various electrically conductive materials. In a case where the organic EL element 10 is a bottom emission type organic EL element, which emits light from a substrate side, the first electrode 5 needs to be transparent or translucent. On the other hand, in a case where the organic EL element 10 is a top emission type organic EL element, which emits light from an opposite side of the substrate, a second electrode 9 needs to be transparent or translucent.

The TFT 2 is prepared by a known method. Although manufacture of an active matrix type organic EL display device, in which a TFT 2 is provided in each pixel, is described in the present embodiment, the present invention is not limited to this. The present invention can be applied also to a passive matrix type organic EL display device, in which no TFT 2 is provided.

The edge cover 6 is provided so as to cover an end section of the first electrode 5 in order to prevent an organic EL layer from having a reduced thickness at the end section of the first electrode 5 and accordingly prevent the first electrode 5 and the second electrode 9 from being short-circuited due to the reduced thickness. The first electrode 5 is exposed at a portion where the edge cover 6 is not present. The exposed portion serves as a light-emitting section of each pixel.

As illustrated in (a) of FIG. 13, organic EL layers are provided on the first electrode 5. An organic EL layer can be, for example, a hole-injection and hole-transport layer 7, luminescent layers 8R, 8G, and 8B, an electron-transport layer (not shown), an electron-injection layer (not shown), and the like.

A carrier blocking layer (not shown) for blocking a flow of a carrier such as a hole or an electron can be inserted as necessary.

Further, a single layer can have a plurality of functions. For example, it is possible to form a single layer that serves as both a hole-injection layer and a hole-transport layer, like the hole-injection and hole-transport layer 7.

In the present embodiment, (i) the first electrode 5 serving as an anode, (ii) the hole-injection and hole-transport layer 7, (iii) the luminescent layers 8R, 8G, and 8B, (iv) the electron-transport layer (not shown), (v) the electron-injection layer (not shown), and (vi) the second electrode 9 serving as a cathode are stacked in this order from a first electrode 5 side.

Note that in a case where the first electrode 5 serves as a cathode, the above order of stacking is reversed.

In the present embodiment, in order to obtain a bottom emission type organic EL element, the first electrode 5 is made from ITO (indium tin oxide).

A material of each of the organic EL layers can be a known material. The luminescent layers 8R, 8G, and 8B can each be made from a single material, or from a mixed material which is obtained by mixing, with a material that serves as a host material, another material as a guest material or a dopant.

Concrete examples of a material that can be used as a material of each of the organic EL layers will be given below.

A material of the hole-injection and hole-transport layer 7 can be, for example, anthracene, azatriphenylene, fluorenone, hydrazone, stilbene, triphenylene, benzine, styrylamine, triphenylamine, porphyrin, triazole, imidazole, oxadiazole, oxazole, polyarylalkane, phenylenediamine, or arylamine; a derivative thereof; or a cyclic or chain conjugated monomer, oligomer, or polymer such as a thiophen compound, a polysilane compound, a vinylcarbazole compound, or an aniline compound.

A material of each of the luminescent layers 8R, 8G, and 8B is a material having a high light emitting efficiency, such as a low molecular fluorescent dye or a metal complex. Examples of the material encompass anthracene, naphthalene, indene, phenanthrene, pyrene, naphthacene, acephenanthrylene, pentaphene, pentacene, coronene, butadiene, coumarin, acridine, and stilbene; a derivative thereof; a tris(8-quinolinolato)aluminum complex; a bis(benzoquinolinolato) berylium complex; a tri(dibenzoylmethyl)phenanthroline europium complex; ditoluylvinylbiphenyl; hydroxyphenyloxazole; hydroxyphenylthiazole; and the like.

A material of the electron-transport layer and the electron-injection layer can be, for example, a tris(8-quinolinolato) aluminum complex, an oxadiazole derivative, a triazole derivative, a phenylquinoxaline derivative, a silole derivative, or the like.

(b) of FIG. 13 is a view illustrating a state in which the organic EL element 10, which includes the first electrode 5, hole-injection and hole-transport layer 7, the luminescent layers 8R, 8G, and 8B, the electron-transport layer, the electron-injection layer, and the second electrode 9, is sealed.

As illustrated in (b) of FIG. 13, in order to prevent the organic EL element 10 from being deteriorated by moisture and oxygen in the atmosphere, a sealing resin 11 is formed in a frame shape in end sections at four sides of a display region of the organic EL display device 1, which includes a plurality of organic EL elements 10. The substrate 3 and a sealing substrate 12 are attached to each other via the sealing resin 11.

In the present embodiment, the sealing substrate 12 is a glass substrate, and the organic EL element 10 is sealed by attaching the substrate 3 and the sealing substrate 12 to each other via the sealing resin 11, which is provided in the frame shape and has adhesiveness. Note, however, that a method of sealing the organic EL element 10 is not limited to this. For example, the organic EL element 10 can be sealed in such a manner that a dense sealing film, through which moisture and oxygen are not easily passed through, is formed on an upper surface of the organic EL element 10 by CVD or the like, and then (i) side surfaces of the organic EL element 10 are entirely coated with an adhesive so as to be attached to a sealing substrate or (ii) fritted glass (powdered glass) is formed in a frame shape around the side surfaces.

It is also possible to use the above-described sealing methods in combination as necessary.

Figure 3:
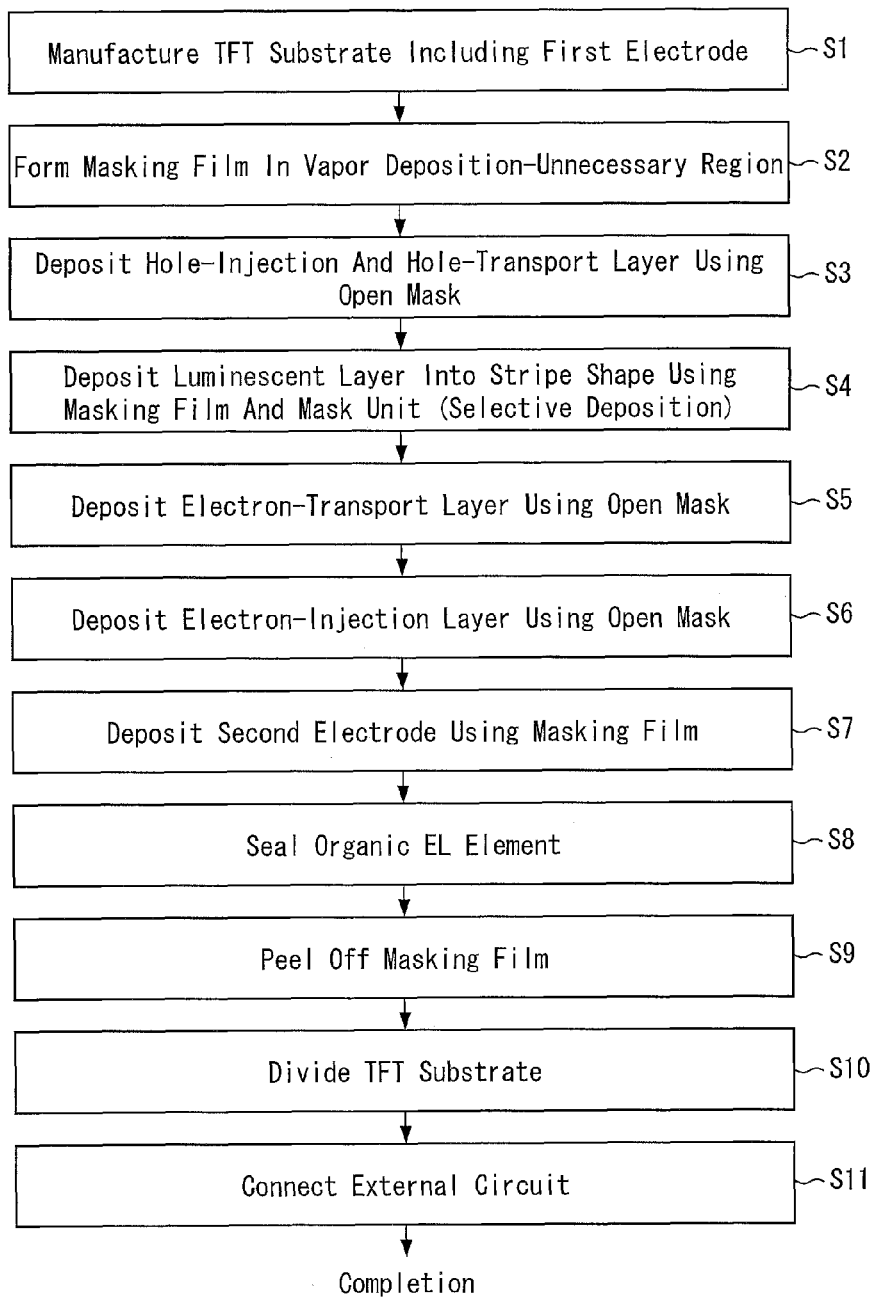
FIG. 3 is a view showing steps of an organic EL display device manufacturing method of Embodiment 1 of the present invention.

FIG. 3 is a view showing an outline of a manufacturing process of the organic EL display device 1.

First, a substrate 3 which includes a TFT and a first electrode electrically connected with the TFT is prepared by a known method (S1).

Then, a masking film 13 (a shielding film that can be peeled off) is formed (i.e., bonded) so as to cover a vapor deposition-unnecessary region R2, in which a terminal section and the like are provided on the substrate 3 (S2).

Figure 1:
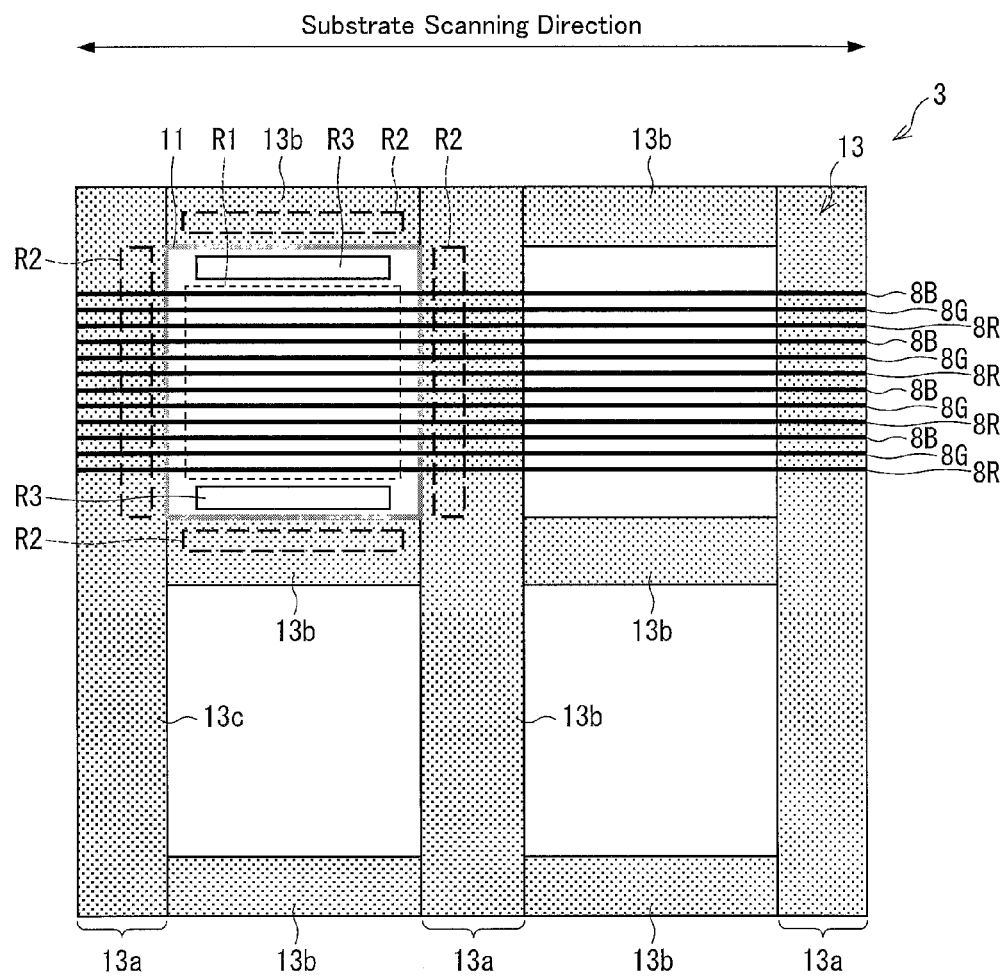
FIG. 1 is a view illustrating a state in which a masking film is patterned on a substrate in an organic EL display device manufacturing method of Embodiment 1 of the present invention.

FIG. 1 is a view illustrating a state in which the masking film 13 is patterned on the substrate 3.

As illustrated in FIG. 1, the masking film 13 is provided only on an outside of the sealing resin 11 provided in the frame shape, and is not provided on an inside of the sealing resin 11.

That is, the masking film 13 is provided only outside a sealing region of each organic EL panel on the substrate 3, and no masking film 13 is provided in a display region R1 (luminescent region) and the sealing region.

The present embodiment employs the masking film 13 which can be peeled off in a latter step. For example, a general masking film 13 that has adhesiveness or tackiness is used. In the present embodiment, the masking film 13 is provided in a pattern as illustrated in FIG. 1, which pattern is realized by arranging a plurality of rectangular films (film members) so that the plurality of rectangular films are allowed to overlap one another. Specifically, for example, the masking film 13 is constituted by (i) a plurality of (e.g., three) long rectangular films 13a which are arranged to extend, for example, in a direction (hereinafter referred to as a scanning perpendicular direction) perpendicular to a substrate scanning direction and (ii) a plurality of (e.g., six) short rectangular films 13b which are arranged to extend, for example, in the substrate scanning direction.

Each of the long rectangular films 13a is provided (i) at an upstream end and a downstream end of the substrate 3 with respect to the substrate scanning direction and (ii) in a region between each adjacent pair of display regions R in the substrate scanning direction, in such a manner that the each of the long rectangular films 13a extends from one end to the other end of the substrate 3 along the scanning perpendicular direction. The short rectangular films 13b are provided in respective regions adjacent to both sides of each display region R1 in the scanning perpendicular direction, in such a manner that the each of the short rectangular films 13b extends in the substrate scanning direction. Note that two short rectangular films adjacent to each other in the substrate scanning direction may be replaced by one long rectangular film that extends from one end to the other end of the substrate 3 along the substrate scanning direction. In this case, the one long rectangular film intersects with the long rectangular films 3a which extend in the scanning perpendicular direction. Note that the masking film 13 may be constituted by a single film in place of the plurality of rectangular films.

The masking film 13 can be any general masking film, but is preferably a masking film having a low water absorptance and a low outgassing characteristic in vacuum.

In a case where the masking film 13 has a high water absorptance, moisture that desorbs from the masking film 13 may damage a film constituting the organic EL element during a step of preparing an organic EL element.

Further, in the step of preparing an organic EL element, a surface of the first electrode is in general subjected to a plasma treatment or a UV treatment before organic layers including at least a luminescent layer are prepared, for the purpose of washing the surface of the first electrode.

It is therefore preferable that, in order to prevent the masking film 13 from being deteriorated to produce a decomposed matter which affects the organic EL element in the plasma treatment or the UV treatment, the masking film 13 have a high resistance against the plasma treatment or the UV treatment. Alternatively, it is more preferable that the masking film 13 be bonded after the plasma treatment or the UV treatment. Further, since a strong adhesive strength of the masking film 13 may cause damage to the TFT substrate when the masking film 13 is peeled off, it is preferable that the adhesive strength be adjusted appropriately for the peeling off. Further, in order to prevent the adhesive from remaining as remnants, it is preferable that the masking film 13 have little adhesive transfer. For example, as a masking film 13 that satisfies the above preferences, it is possible to use a general slightly adhesive removable film. Note that although the masking film 13 which can be bonded and removed is used in the present embodiment as a pattern film that is removable in a latter step, the present embodiment is not limited to this. For example, the pattern film that is removable in a latter step may be formed by screen printing or the like.

Note that the masking film 13 can be bonded by use of a general laminating device. A semiconductor processing device as used in a TFT preparation step requires an advanced mechanism control, an advanced material management, and an advanced temperature control, and therefore requires very high facility costs. In contrast, a laminating device does not require such advanced controls and is therefore a facility less expensive than the semiconductor processing device. Similarly, the laminating device is less expensive than a device for manufacturing an organic EL display device.

Then, a shadow mask having an opening of a predetermined shape is brought into close contact with and fixed to the masking film 13 on the substrate 3, and a hole-injection and hole-transport layer is formed by a conventional vacuum deposition method over an entire surface (S3).

Although the hole-injection and hole-transport layer is formed by use of the shadow mask in the present embodiment, it is also possible to form the hole-injection and hole-transport layer by combined use of the masking film 13 and the shadow mask. That is, second electrode connecting sections R3 are included in the opening of the masking film 13 in FIG. 1. As such, in a case where the hole-injection and hole-transport layer is formed by use of only the masking film 13 as a mask, the hole-injection and hole-transport layer is formed also on the second electrode connecting sections R3. In this case, an organic film is interposed between each of the second electrode connecting sections R3 and the second electrode. This may cause a loose connection. In view of this, a shadow mask that shields parts corresponding to the second electrode connecting sections R3 is used, and the masking film 13 is used as a mask to shield a part other than the parts corresponding to the second electrode connecting sections R3. This makes it possible to form a hole-injection and hole-transport layer having a predetermined shape. Note that, since the hole-injection and hole-transport layer can be deposited at once over an entire surface of the plurality of organic EL elements, it is not necessary to carry out a high-precision patterning. It will therefore suffice to use an open mask that has an opening over the entire display region R1. The open mask does not require a very large frame for holding the mask and therefore does not increase a weight of the frame. This allows the open mask to be applied to deposition to a large substrate. Further, in a case where the masking film 13 is used together with the open mask, a minimum region to be shielded by the open mask is only the second electrode connecting sections R3, and there is no need of considering shielding a part other than the second electrode connecting section R3. This reduces the need of high precisions in processing and positioning the opening. Accordingly, a cost of preparing the open mask and a cost of a facility such as a mechanism for positioning a mask are reduced.

Figure 14:
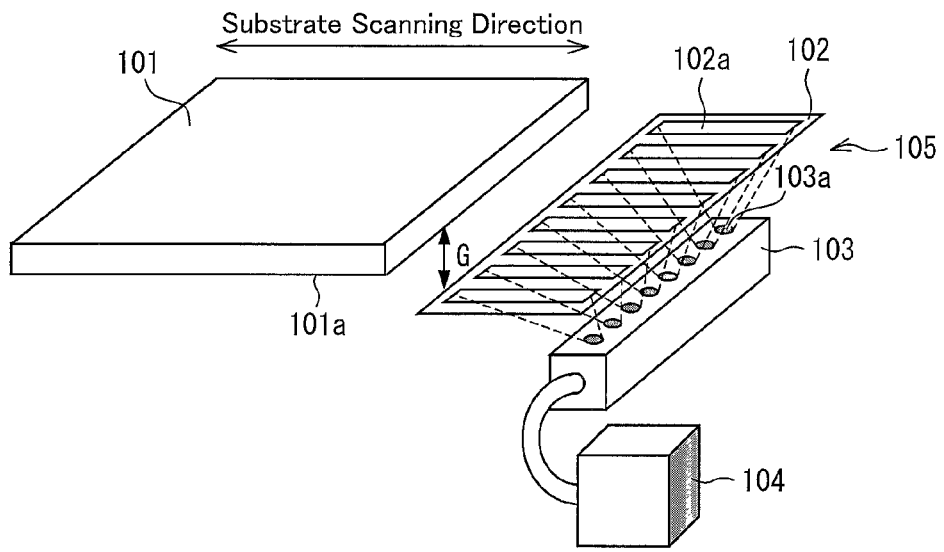
FIG. 14 is a view illustrating an example of a vapor deposition device that can be used in an organic EL display device manufacturing method of Embodiment 3 of the present invention.

Next, deposition was carried out while the substrate 101 is scanned, to the right and left as viewed in FIG. 14, over the mask unit 105, which employs the shadow mask 102 that is smaller in width in the scanning direction than the substrate 101 as illustrated in FIG. 14 and in which the shadow mask 102 having the opening 102a, the nozzle 103 having the nozzle opening 103a, and the vapor deposition material supply source 104 connected with the nozzle 103 are integrally formed. Thus formed are the luminescent layers 8R, 8G, and 8B having, as illustrated in FIG. 1, a stripe pattern extending to the right and left in FIG. 1 (S4).

In the present embodiment, shadow masks 102 for the respective colors R, G, and B, which shadow masks 102 have respective openings only in portions corresponding to respective subpixels of R, G, and B, have a longitudinal length that is set to be equal to a length of the display region R1 along a top-to-bottom direction of FIG. 1. In forming the luminescent layers 8R, 8G, and 8B in a display region R1 at an upper end in FIG. 1, the substrate 3 is scanned over the mask unit 105 to the right as viewed in FIG. 1. In forming the luminescent layers 8R, 8G, and 8B in a display region R1 at a lower end in FIG. 1, the substrate 3 is moved with respect to the mask unit 105 toward the top in FIG. 1 and, after an alignment is adjusted, the substrate 3 is scanned over the mask unit 105 to the left as viewed in FIG. 1.

Note that a shape of a shadow mask 102 is not limited to this, and can be set appropriately as long as no self-weight bending and extension of the shadow mask 102 occurs. It is also possible to carry out deposition at once to the display regions 1 at the upper end and the lower end in FIG. 1.

In depositing the luminescent layer 8R, the luminescent layer 8R is formed by injecting R (red) deposition particles from the vapor deposition material supply source 104 so as to carry out deposition by scanning as described above by use of the shadow mask 102 having the opening only in the portion corresponding to the subpixel R. Thus, the luminescent layer 8R is formed in each subpixel R.

The luminescent layer 8G and the luminescent layer 8B were formed by the same method in the portions corresponding to the respective subpixels.

That is, in the present embodiment, the luminescent layers 8R, 8G, and 8B are formed by the selective vapor deposition method employing the scanning technique.

As such, as illustrated in FIG. 1, the luminescent layers 8R, 8G, and 8B each having a stripe pattern are formed on the hole-injection and hole-transport layer in the display region R1 (luminescent region) and the sealing region, in neither of which the masking film 13 is provided. On the other hand, in the vapor deposition-unnecessary region R2, in which the masking film 13 is provided, the luminescent layers 8R, 8G, and 8B each having a stripe pattern are formed in the hole-injection and hole-transport layer on the masking film 13.

Figure 15:
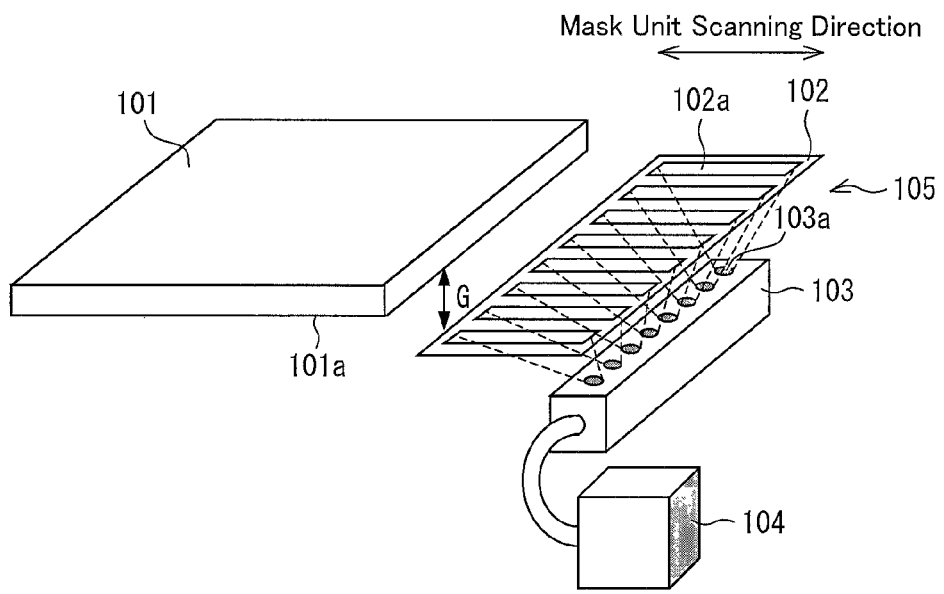
FIG. 15 is a view illustrating an example of a vapor deposition device that can be used in an organic EL display device manufacturing method of Embodiment 3 of the present invention.
Figure 16:
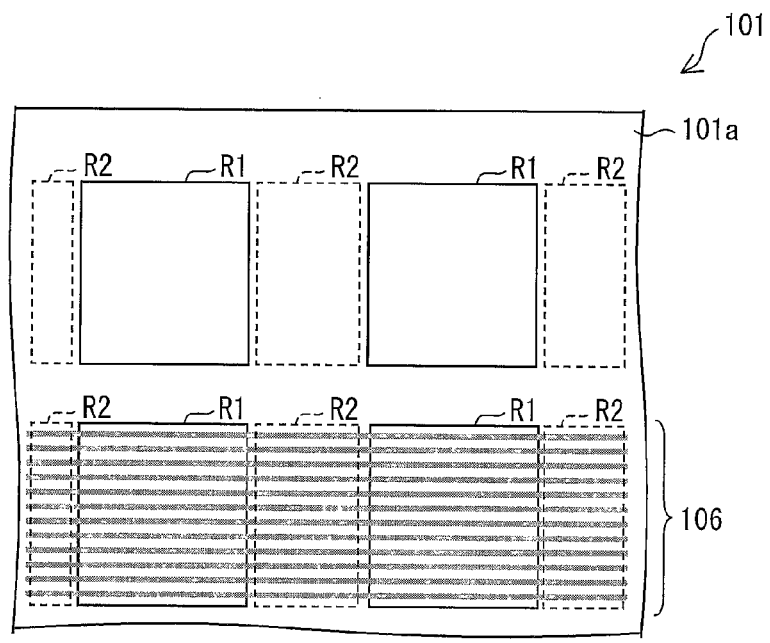
FIG. 16 is a view illustrating a state in which a vapor-deposited film formed on a substrate by the vapor deposition device illustrated in FIG. 14 or 15.
Figure 17:
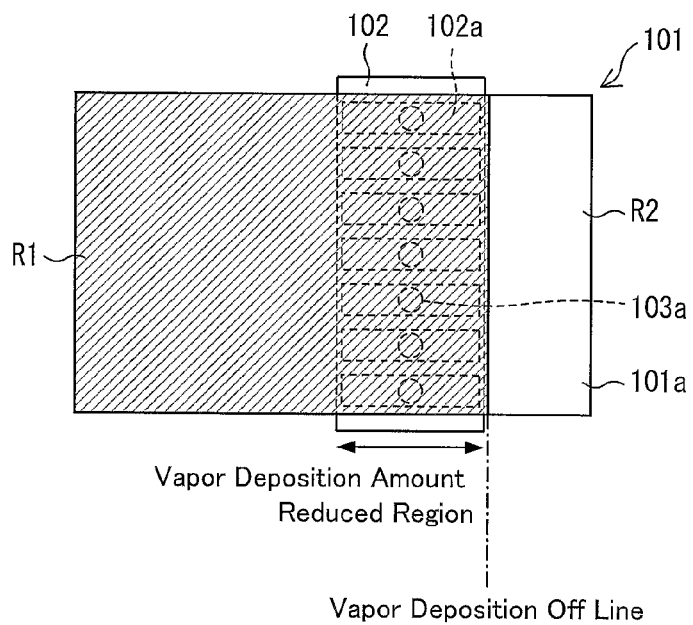
FIG. 17 is a view for explaining why a vapor-deposited film having a stripe pattern is formed also in a vapor deposition-unnecessary region.
Figure 18:
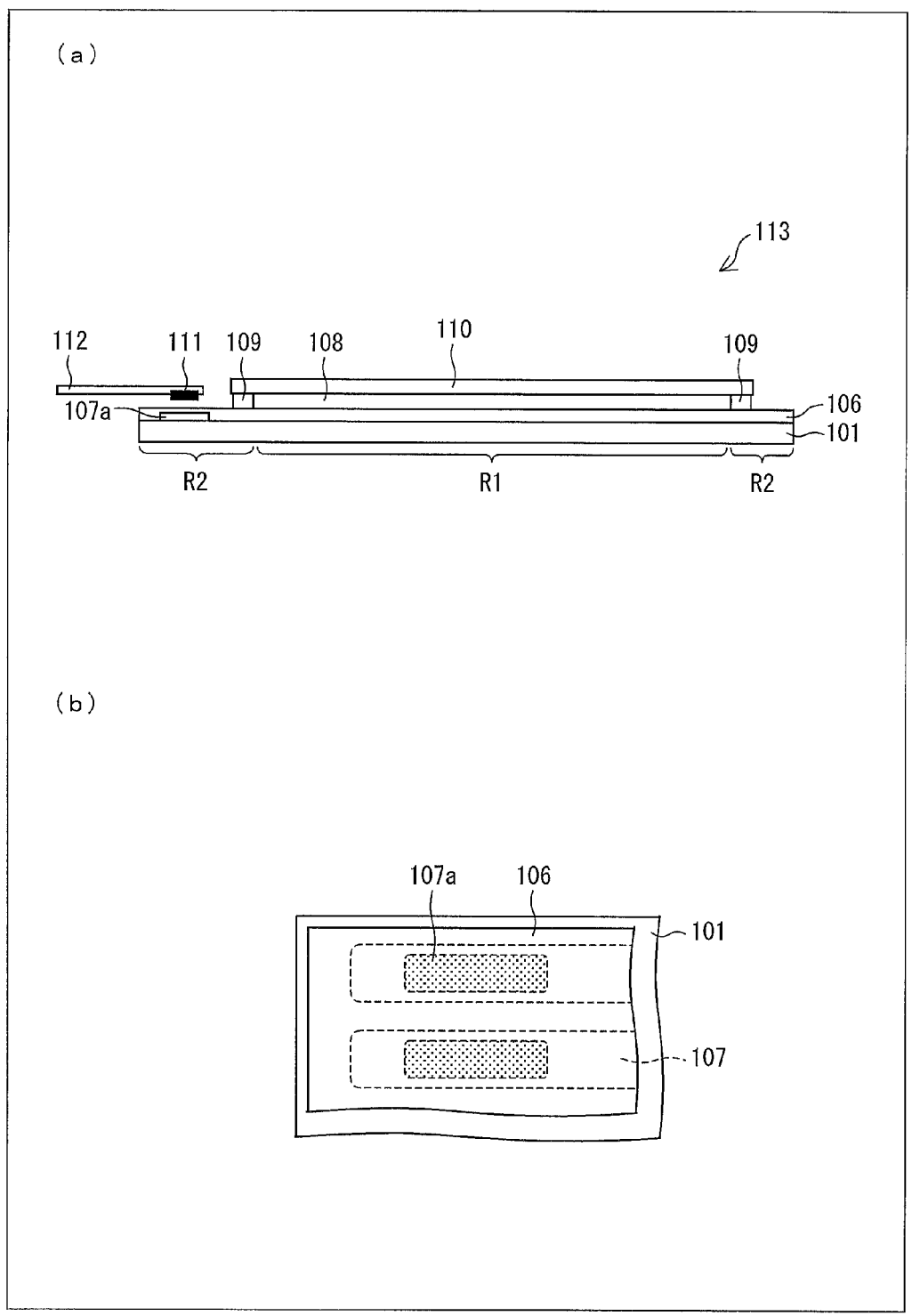
FIG. 18 is a view for describing problems which may be caused by a vapor-deposited film formed in a vapor deposition-unnecessary region.

In the present embodiment, deposition is carried out by scanning the substrate 101 over the mask unit 105, as illustrated in FIG. 14. Note, however, that deposition can be carried out by scanning the mask unit 105 over the substrate 101, as illustrated in FIG. 15.

Further, in the present embodiment, the luminescent layers 8R, 8G, and 8B having the stripe pattern are formed on the vapor-deposited surface 101a of the substrate 101 so that the gap G of a predetermined distance is provided between the vapor-deposited surface 101a of the substrate 101 and the shadow mask 102, as illustrated in FIG. 14. Note, however, that the luminescent layers 8R, 8G, and 8B having the stripe pattern can be formed by scanning in a state where the vapor-deposited surface 101a of the substrate 101 and the shadow mask 102 are in close contact with each other.

Further, in the present embodiment, a vapor deposition device as illustrated in FIG. 14 is used for the purpose of forming the luminescent layers 8R, 8G, and 8B having the stripe pattern, but a type of a vapor deposition device to be used is not limited to a specific one as long as it can form a film having a uniform film thickness and a high resolution stripe pattern.

Subsequently, a shadow mask having an opening of a predetermined shape is brought into close contact with and fixed to the masking film 13 on the substrate 3, and an electron-transport layer and an electron-injection layer are formed sequentially over an entire surface by a conventional vacuum deposition method (S5, S6).

Then, the second electrode is sequentially formed over an entire surface by a conventional vacuum deposition method by use of the masking film 13 on the substrate 3 as a mask (S7).

Then, as illustrated in FIG. 1, parts of the second electrode, which is provided over an entire surface of (i) the sealing region including the display region R1 and (i) the region in which the masking film 13 is provided, are electrically connected with wires on the substrate 3 via the second electrode connecting sections R3 provided on the substrate 3, which parts are provided in an upper end part and a lower end part of the display region R1, respectively.

In the present embodiment, the electron-transport layer and the electron-injection layer are formed by use of the shadow mask. Note, however, that it is possible to use the masking film 13 together with the shadow mask, as described on the formation of the hole-injection and the hole-transport layer. Note that the electron-injection layer can be formed by the same method as that used in the formation of the second electrode, provided that an electric connection between each of the second electrode connecting sections R3 and the second electrode is not affected. That is, the electron-injection layer can also be formed by use of only the masking film 13 as a mask.

The substrate 3, deposition on which is thus completed, is subjected to a sealing process of a sealing region including the display region R1, in order to prevent the organic EL element, which includes the first electrode, the hole-injection and hole-transport layer, the luminescent layers 8R, 8G, and 8B, the electron-transport layer, the electron-injection layer, and the second electrode, from being deteriorated by moisture and oxygen in the atmosphere (S8).

As illustrated in FIG. 1, the sealing resin 11 is formed in a frame shape in end sections at four sides of the sealing region including the display region R1, and the substrate 3 and the sealing substrate (not shown) are attached to each other via the sealing resin 11.

Then, the masking film 13 is peeled off (S9). Peeling off the masking film 13 allows films (the hole-injection and hole-transport layer, the luminescent layers 8R, 8G, and 8B, the electron-transport layer, the electron-injection layer, and the second electrode) stacked on a surface of the masking film 13 to be peeled off as well. Note that the masking film 13 is designed to be peeled off mechanically in a film state. A peeling device for peeling off the masking film 13 can be a device that simply peels off the film mechanically. Accordingly, the peeling device is an inexpensive facility like the laminating device, as described above, for bonding the masking film 13.

Figure 2:
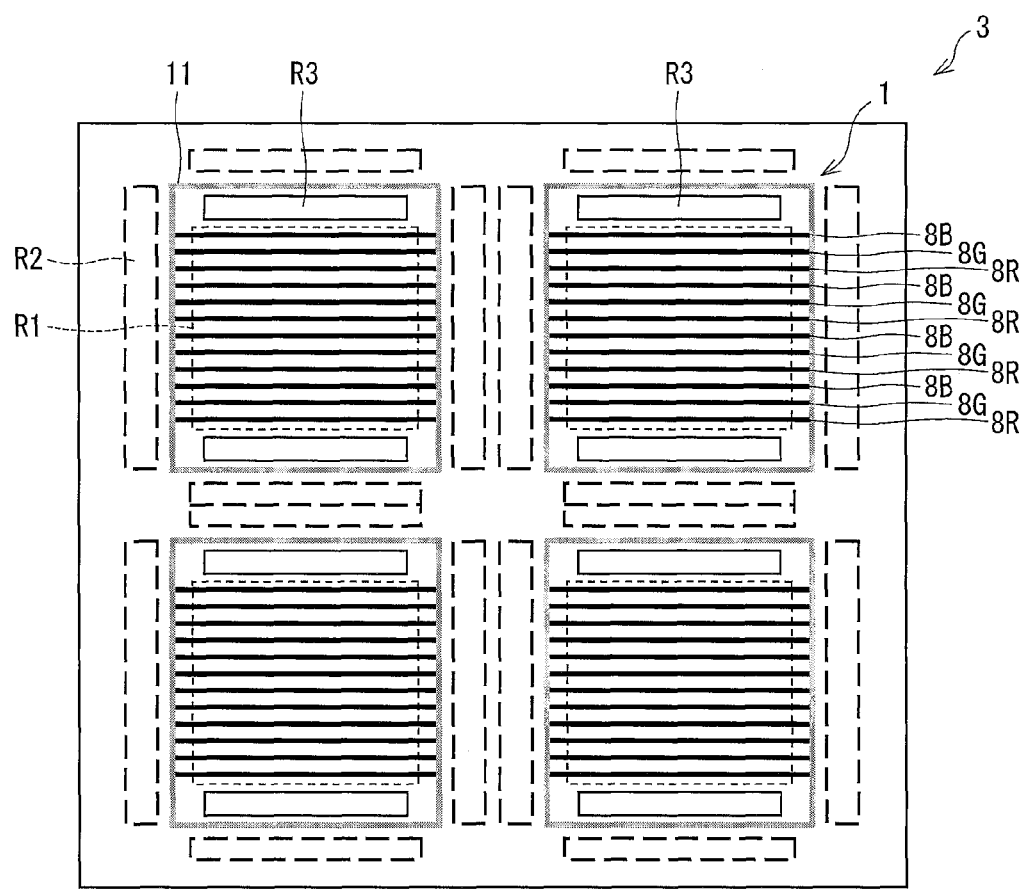
FIG. 2 is a view illustrating a substrate in a state after a masking film is peeled off in an organic EL display device manufacturing method of Embodiment 1 of the present invention.

FIG. 2 is a view illustrating the substrate 3 in a state after the masking film 13 is peeled off.

As illustrated in FIG. 2, the hole-injection and hole-transport layer, the luminescent layers 8R, 8G, and 8B, the electron-transport layer, the electron-injection layer, and the second electrode are not stacked in the vapor deposition-unnecessary region R2, but are stacked only in the sealing region including the display region R1 in which the first electrode is provided.

Subsequently, the substrate 3 is divided for each organic EL panel (S10), and a connection with an external circuit (driving circuit) is made by use of the terminal section provided in the vapor deposition-unnecessary region R2 (S11). Thus, the organic EL display device 1 is completed.

The organic EL display device 1 is manufactured by the steps described above. An electric current is supplied from the driving circuit, which is provided outside, to the organic EL element of each subpixel, so that the organic EL element emits light. In this manner, a desired display can be carried out.

Next, merits obtained by having the masking film 13 that can be peeled off in a latter step will be discussed in detail based on comparison with an organic EL display device manufacturing process which uses the selective vapor deposition method employing the conventional scanning technique, in which the masking film 13 that can be peeled off in a latter step is not provided.

Figure 4:
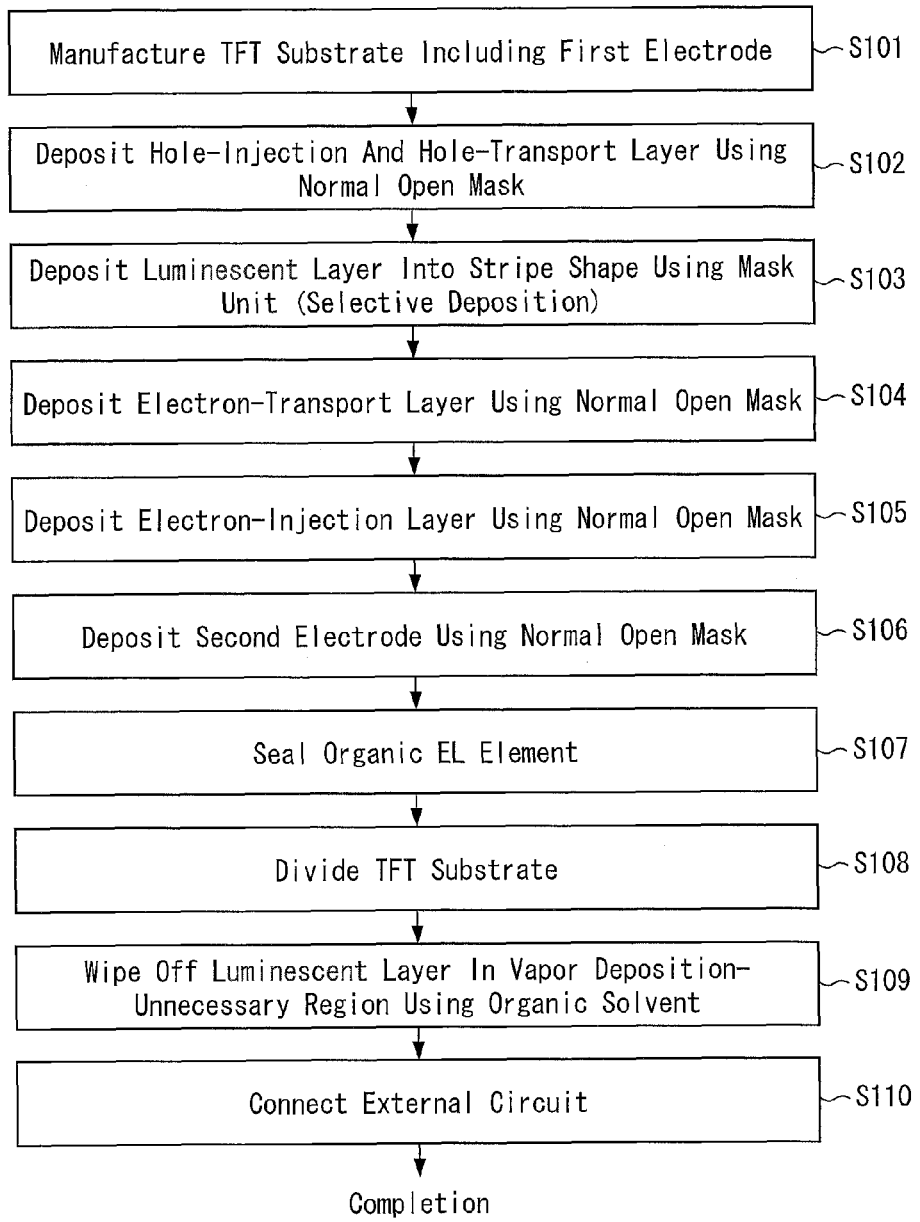
FIG. 4 is a view showing an outline of an organic EL display device manufacturing process which uses a selective vapor deposition method employing a conventional scanning technique.

FIG. 4 is a view showing an outline of the organic EL display device manufacturing process which uses the selective vapor deposition method employing the conventional scanning technique, in which no pattern film that can be peeled off in a latter step is provided.

As shown in FIG. 4, first, a substrate including a TFT and a first electrode electrically connected with the TFT is manufactured by a known method (S101).

Then, a hole-injection and hole-transport layer is formed on an entire surface of the substrate by vacuum deposition by use of a normal open mask (S102), since no masking film 13 is provided.

In the organic EL display device manufacturing process of FIG. 4 in which the selective vapor deposition method employing the conventional scanning technique is used, it is necessary to carry out deposition by use of only the normal open mask, since the lack of the masking film 13 makes it impossible to make combined use of the masking film 13 as a mask.

Therefore, in the manufacturing process of the present invention for manufacturing the organic EL display device 1, it is possible to simplify a vapor deposition mask (open mask) and reduce time for mounting, accordingly. This makes it possible to improve cycle time (improve productivity) of a device and reduce a facility cost. Consequently, a reduction in manufacturing cost of the organic EL display device is achieved.

Further, in the manufacturing process, shown in FIG. 3, of the present invention for manufacturing the organic EL display device 1, the masking film 13 can be used together as a mask. This reduces an area in which the open mask is in close contact with the substrate. Accordingly, it is possible to reduce damage to a pattern on the substrate caused by a contact between the substrate and the open mask. Further, since the masking film 13 also serves as a protection film for the terminal section by covering the vapor deposition-unnecessary region R2 in which the terminal section is provided, it is possible to prevent a direct contact between the open mask and the terminal section. This makes it possible to prevent the open mask from causing damage to the terminal section. Consequently, an improvement in yield of the organic EL display device is achieved.

Further, since the masking film 13 covers the vapor deposition-unnecessary region R2 in which the terminal section is provided, it is possible to prevent foreign matters from being mounted on the terminal section. This allows an improvement in reliability of the organic EL display device. Further, tackiness of the masking film 13 allows foreign matters, which have been adhered before the a masking film 13 is attached, to be eliminated. This allows an improvement in yield of the organic EL display device.

Then, by use of the vapor deposition device as illustrated in FIG. 14, a luminescent layer having a stripe pattern is manufactured in the same manner as the manufacturing process of the present invention for manufacturing the organic EL display device 1 (S103).

However, in the organic EL display device manufacturing process of FIG. 4 in which the selective vapor deposition method employing the conventional scanning technique is used, no masking film 13 that covers the vapor deposition-unnecessary region R2 is provided. As such, the luminescent layer having the stripe pattern is deposited also in the vapor deposition-unnecessary region R2. As a result, the luminescent layer is deposited directly on the terminal section.

Accordingly, a step (S109) of wiping off, with an organic solvent, the luminescent layer provided in the vapor deposition-unnecessary region R2 is required separately (this step will be described later in detail). This invites decreases in productivity and yield of the organic EL display device.

Then, an electron-transport layer, an electron-injection layer, and a second electrode are formed sequentially on an entire surface of the substrate by a conventional vacuum deposition method by use of only a normal open mask (S104, S105, and S106), since no masking film 13 is provided.

In the step of forming the electron-transport layer and the step of forming the electron-injection layer, the lack of the masking film 13 makes it impossible to make combined use of the masking film 13 as a mask. This creates similar problems as those explained in the description of the step (S102) of forming the hole-injection and hole-transport layer over an entire surface of the substrate by vacuum deposition. Further, in the step of forming the second electrode, a normal open mask needs to be used, since it is not possible to use the masking film 13 as a mask. This not only causes similar problems as those caused in the formation of the electron-transport layer and the electron-injection layer, but also requires a facility associated with the use of the open mask.

Subsequently, in a similar manner as the manufacturing process, shown in FIG. 3, of the present invention for manufacturing the organic EL display device 1, a step (S107) of sealing the organic EL element and a step (S108) of dividing the substrate for each organic EL panel are carried out.

Then, a step (S109) of wiping off the luminescent layer, which is provided in the vapor deposition-unnecessary region R2, is carried out by use of an organic solvent.

In the manufacturing process, shown in FIG. 3, of the present invention for manufacturing the organic EL display device 1, the step of wiping off is not necessary, since the masking film 13 can be easily removed by simply mechanically peeling off the masking film 13. By contrast, in the organic EL display device manufacturing process of FIG. 4 in which the selective vapor deposition method employing the conventional scanning technique is used, the step of wiping off is an essential step, and the following problems may be caused during the step of wiping off.

First, in the step of wiping off, the luminescent layer which has been deposited needs to be wiped off the vapor deposition-unnecessary region R2 directly by use of the organic solvent, and at this time, remnants tend to be left because it is not easy to remove completely the luminescent layer deposited.

Further, in the step of wiping off, there tend to be foreign matters that are newly mounted. In a case where the foreign matters are present in the vapor deposition-unnecessary region R2 in which a terminal section or the like is provided, an electrical failure is caused when the terminal section is connected with an external circuit. This invites a decrease in yield of the organic EL display device.

There is another problem that, in a case where a sealing substrate and the substrate are attached to each other by use of a sealing resin or the like, the organic solvent causes damage to the sealing resin, so that the reliability of the organic EL display device is degraded.

Subsequently, a connection with the external circuit (driving circuit) is made by use of the terminal section, from which the luminescent layer has been wiped off (S110). Thus, the organic EL display device is completed.

Figure 5:
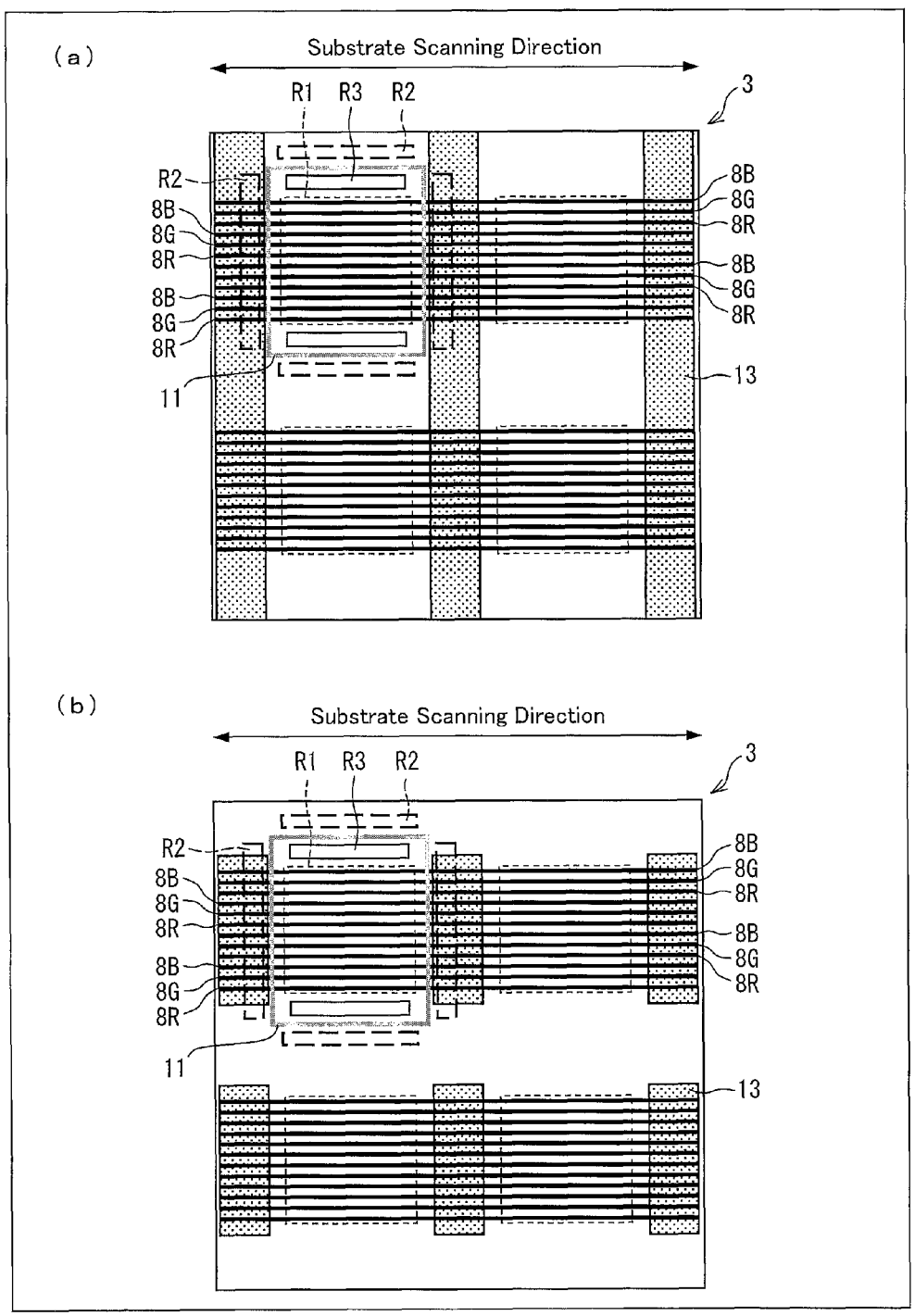
FIG. 5 is a view of examples of a shape of a pattern of a masking film which can be used in an organic EL display device manufacturing method of Embodiment 1 of the present invention.

The following description will discuss, with reference to FIG. 5, an example of other patterns of the masking film 13 which can be used in the manufacturing process of the present invention for manufacturing the organic EL display device 1.

FIG. 5 is a view illustrating cases in which three types of subpixels, each of which has an organic EL element including a luminescent layer of a corresponding one of the colors red (R), green (G), and blue (B), are arranged so as to be adjacent to each other in a top-to-bottom direction of FIG. 5 to thereby constitute each pixel of the organic EL display device. FIG. 5 illustrates examples in which the masking film 13 is provided at least in a region, within the vapor deposition-unnecessary region R2, in which the luminescent layers 8R, 8G, and 8B are provided.

As illustrated in FIG. 5, in the vapor deposition-unnecessary region R2, a region in which the luminescent layers 8R, 8G, and 8B having the stripe pattern are not provided does not necessarily have to be covered with the masking film 13. As such, the masking film 13 can be formed, as illustrated in (a) of FIG. 5, into a stripe shape extending in the top-to-bottom direction of (a) of FIG. 5 or into an island shape as illustrated in (b) of FIG. 5.

In a case where, as illustrated in FIG. 5, a region which is not covered with the masking film 13 exists in the vapor deposition-unnecessary region R2, fewer effects are obtained (e.g., there is a region in which the masking film 13 cannot be used as a mask when an organic film other than the luminescent layers 8R, 8G, and 8B is deposited) as compared with a case in which the masking film 13 is formed into a pattern as illustrated in FIG. 1. However, as to the luminescent layers 8R, 8G, and 8B having the stripe pattern, a high-resolution patterning can be carried out.

Further, forming the masking film 13 into a pattern as illustrated in FIG. 5 allows a reduction in an amount of the masking film 13 used. This makes it possible to reduce a material cost and an amount of degassing from the masking film 13. The reduction in the amount of degassing allows a further decrease in negative effects on the organic EL element.

Note that the shapes of patterns of the masking film 13 illustrated in FIG. 5 are mere examples. A shape of a pattern of the masking film 13 can be appropriately determined in consideration of the number, arrangement, model, size, and the like of organic EL panels on the surface of the substrate.

Further, in the present embodiment, as illustrated in FIG. 14, the luminescent layers 8R, 8G, and 8B each having a stripe pattern are formed on the vapor-deposited surface 101a of the substrate 101 by carrying out deposition while the substrate 101 is scanned over the mask unit 105, which is fixed, to the right and left as viewed in FIG. 14 in a state where the gap G between the vapor-deposited surface 101a of the substrate 101 and the shadow mask 102 is maintained constant. Note, however, that the present embodiment is not limited to this. It is possible to carry out deposition by causing the substrate 101 to slide in a state where the vapor-deposited surface 101a of the substrate 101 is in close contact with the shadow mask 102.

In this case, damage to the vapor-deposited surface 101a of the substrate 101, which may be caused by the close contact between the vapor-deposited surface 101a of the substrate 101 and the shadow mask 102, can be prevented by means of the masking film 13.

Further, although the hole-injection and hole-transport layer, the electron-transport layer, and the electron-injection layer are deposited by use of the open mask in the present embodiment, it is possible to form the layers by the deposition method as illustrated in FIG. 14, like the luminescent layers as described above. In this case, a mask having an opening over an entire surface of the display region R1 may be used in place of the mask patterned into the stripe shape.

Figure 6:
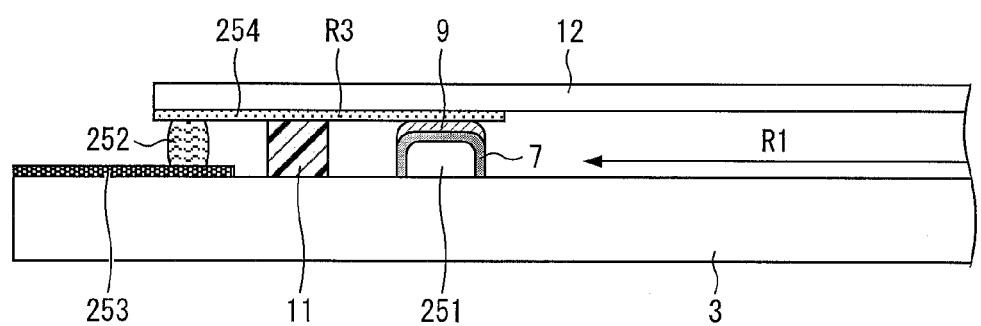
FIG. 6 is a view illustrating an example of a method of forming a hole-injection and hole-transport layer, an electron-transport layer, and an electron-injection layer without using an open mask in an organic EL display device manufacturing method of Embodiment 1 of the present invention.

Further, in the present embodiment, the hole-injection and hole-transport layer, the electron-transport layer, and the electron-injection layer are deposited by use of the open mask, but it is also possible to form the layers without the open mask in a similar manner as the second electrode is formed, provided that there is another means for connecting the second electrode with a wire of the substrate 3. For example, as illustrated in FIG. 6, a protruding section 251 is formed on the substrate 3 by use of the edge cover 6 or the like, and the hole-injection and hole-transport layer 7, the electron-transport layer (not shown), the electron-injection layer (not shown), and the second electrode 9 are formed on the protruding section 251. The sealing substrate 12 is provided with the second electrode connecting section R3, which is in contact with the second electrode 9. The second electrode connecting section R3 is extracted to an outside of the sealing section by means of the wire 254 on the sealing substrate 12 and is connected with a wire 253 of the substrate 3 by means of a conductive paste 252. This structure allows the second electrode 9 to be connected with the external circuit. In a case where the structure is employed, an organic layer other than the luminescent layers and the second electrode 9 can each be formed into a predetermined shape without a mask. This makes it possible to not only prevent damage to the pattern on the substrate 12 caused by a contact between the substrate 12 and the vapor deposition mask, but also reduce the masking film 13 as a vapor deposition mask. Accordingly, cycle time of a device can be improved due to a reduction in time for mounting the vapor deposition mask, and a facility cost can be reduced. Consequently, the organic EL display device 1 has a reduced cost. In addition, in a case where, as illustrated in FIG. 14, a luminescent layer is formed while the gap G is maintained between the substrate 101 and the vapor deposition mask 102, the vapor deposition mask never comes in contact with the substrate during the manufacturing process of the organic EL element. Accordingly, there is no possibility of damage to the pattern on the substrate caused by a contact between the substrate and the vapor deposition mask. This allows a further improvement in yield of the organic EL display device 1.

Embodiment 2

Next, with reference to FIGS. 7 through 9, a second embodiment of the present invention will be described. The present embodiment is different from Embodiment 1 in that, after steps of forming organic layers including luminescent layers 8R, 8G, and 8B, a sealing film is formed by use of a masking film 13 as a mask, and subsequently, the masking film 13 is peeled off and then an organic EL element is sealed by use of a sealing substrate. Other configurations are the same as those described in Embodiment 1. For easy explanation, the same reference signs will be given to members each having the same function as a member illustrated in the figures of Embodiment 1, and descriptions on such a member will be omitted.

Figure 9:
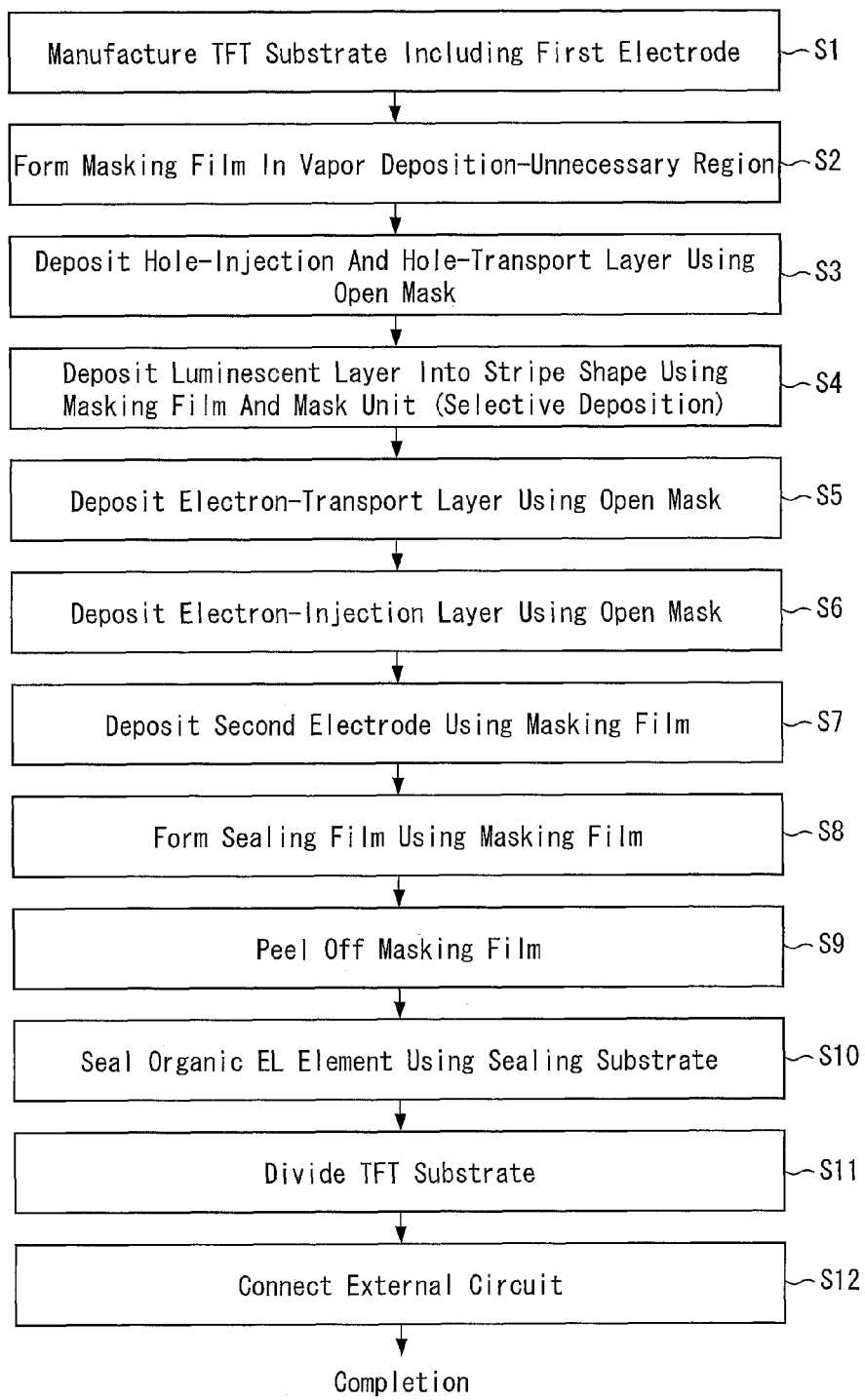
FIG. 9 is a view showing steps of an organic EL display device manufacturing method of Embodiment 2 of the present invention.

FIG. 9 is a view showing an outline of a manufacturing process of an organic EL display device 1a.

Descriptions on steps S1 through S7 in FIG. 9 are omitted since they are the same as the steps S1 through S7 described in FIG. 3 in Embodiment 1.

Figure 7:
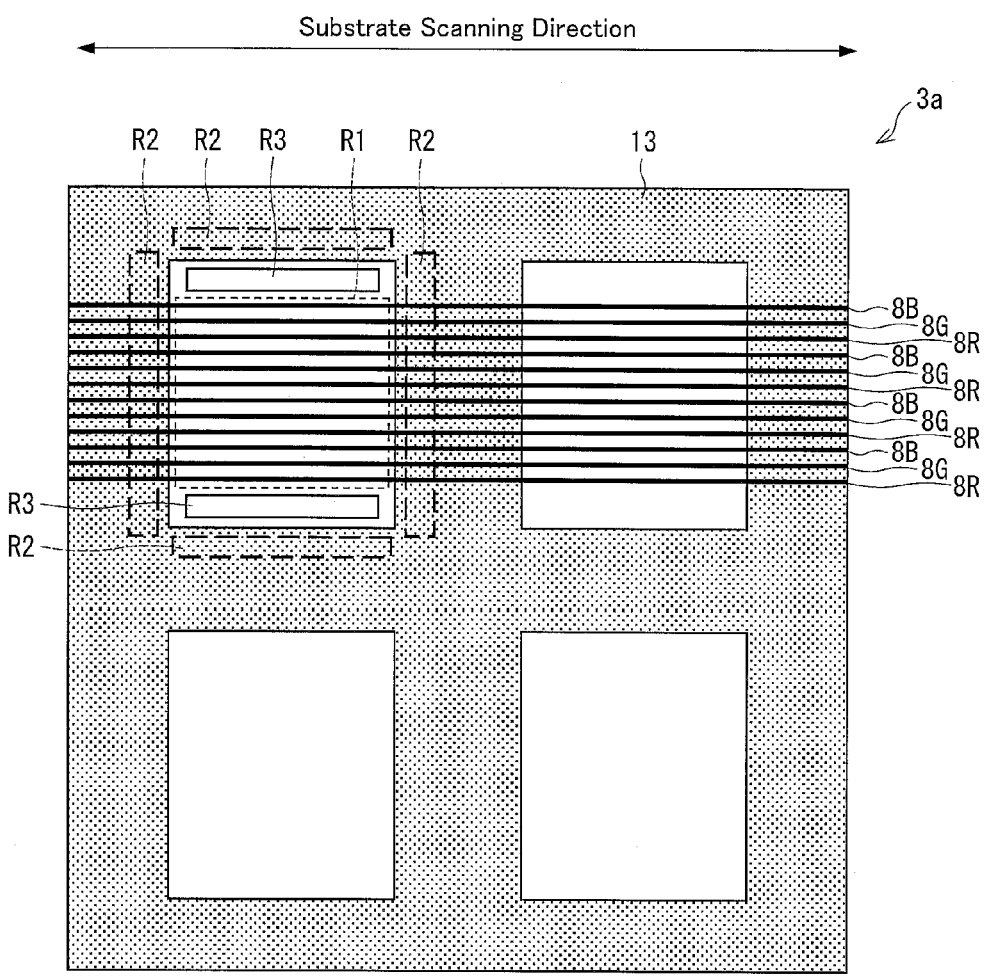
FIG. 7 is a view illustrating (i) a shape of a pattern of a masking film formed on a substrate and (ii) luminescent layers in an organic EL display device manufacturing method of Embodiment 2 of the present invention.

FIG. 7 is a view illustrating (i) a shape of a pattern of a masking film 13 provided on a substrate 3a included in the organic EL display device 1a and (ii) luminescent layers 8R, 8G, and 8B.

the masking film 13 as illustrated in FIG. 7 is used as a mask so as to seal an organic EL element by (i) forming a dense sealing film (not shown), through which moisture and oxygen are not easily passed through, by CVD on a second electrode, which is an upper surface of an organic EL element and (ii) forming a sealing resin or fritted glass (powdered glass) in a frame shape around side surfaces of the organic EL element (S8).

In the present embodiment, the masking film 13 is used as a mask in formation of the luminescent layers 8R, 8G, and 8B and the second electrode and in formation of the sealing film. Note, however, that the present embodiment is not limited to this. As described in Embodiment 1, an organic layer other than the luminescent layers can be formed by use of the masking film 13 alone or by combined use of the masking film 13 and an open mask.

Subsequently, the masking film 13 is peeled off (S9). Note that, at this time, the organic EL element is not damaged in the step of peeling off since the organic EL element is protected with the sealing film and the like.

Then, the substrate 3a, deposition on which is thus completed, is subjected to a sealing process of a sealing region including the display region R1, in order to prevent the organic EL element, which includes a first electrode, a hole-injection and hole-transport layer, the luminescent layers 8R, 8G, and 8B, an electron-transport layer, an electron-injection layer, and the second electrode, from being deteriorated by moisture and oxygen in the atmosphere (S10).

Figure 8:
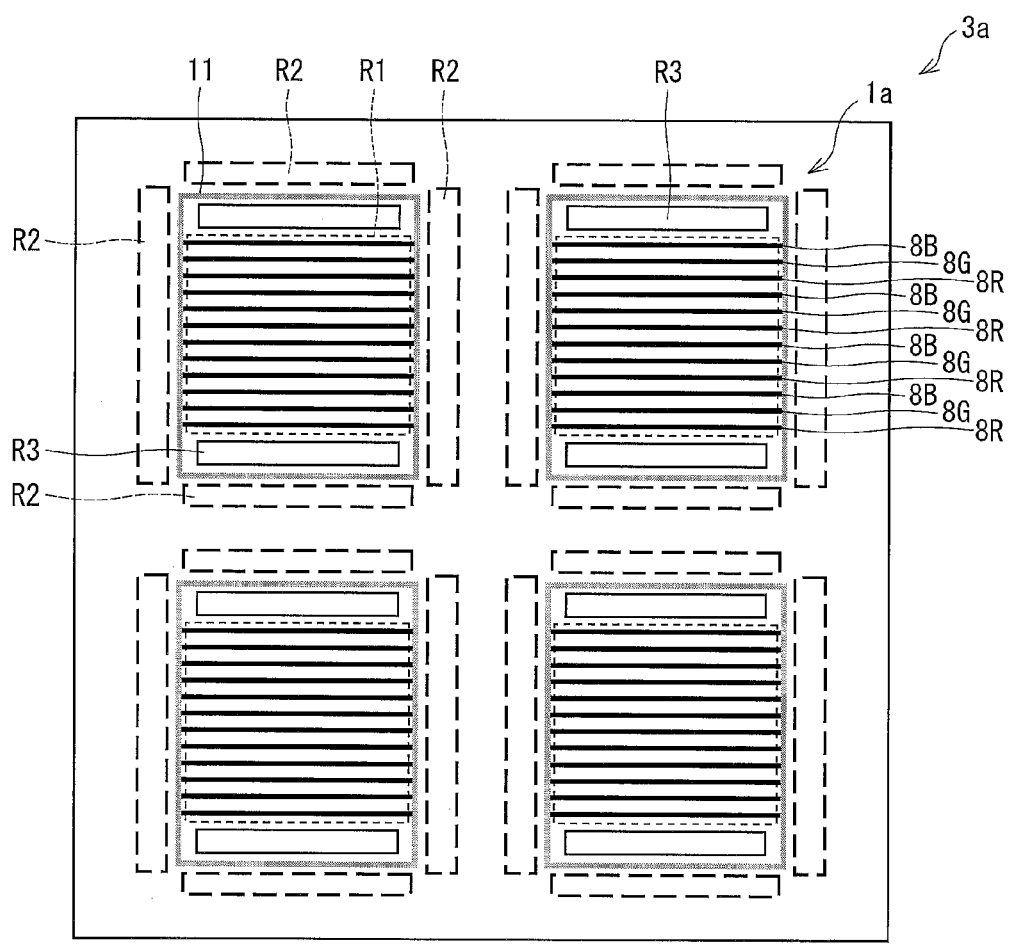
FIG. 8 is a view illustrating a substrate after a step of peeling off a masking film and a step of sealing a sealing region are carried out in an organic EL display device manufacturing method of Embodiment 2 of the present invention.

As illustrated in FIG. 8, the sealing resin 11 is formed in a frame shape in end sections at four sides of the sealing region including the display region R1, and the substrate 3a and the sealing substrate (not shown) are attached to each other via the sealing resin 11.

Then, the substrate 3a is divided for each organic EL panel (S11), and a connection with an external circuit (driving circuit) is made by use of a terminal section provided in a vapor deposition-unnecessary region R2 (S12). Thus, the organic EL display device 1a is completed.

In the organic EL display device 1a manufactured in this manner, no vapor-deposited film is formed in the vapor deposition-unnecessary region R2. As such, the problem of formation of a vapor-deposited film in the vapor deposition-unnecessary region R2 is solved easily as Embodiment 1.

Further, since it is possible to use the masking film 13 as a vapor deposition mask, cycle time of a device can be improved due to a reduction in time for mounting the vapor deposition mask, and a facility cost can be reduced. Consequently, the organic EL display device 1a has a reduced cost.

At the same time, due to a reduction in number of times the mask is in close contact with the substrate 3a, it is possible to reduce damage to a surface of organic EL panels. This leads to an improvement in yield of the organic EL display device 1a.

In the present embodiment, the second electrode and the sealing film are formed by deposition method. Note, however, that the present embodiment is not limited to this, and other film forming methods such as sputtering can be used.

In a case where formation of the second electrode alone can protect the organic EL element from degradation in the step of peeling off the photoresist 13, the step of forming the sealing film can be omitted.

In FIG. 8, an outer edge of the sealing region, which is a region surrounded by the sealing resin 11, is also included in the vapor deposition-unnecessary region R2 and protected with the masking film 13 (see FIG. 7).

As such, in a case where the organic EL element is sealed with the sealing resin 11 and the fritted glass (powdered glass) in a frame shape or in a case where the sealing is carried out by attaching the sealing substrate and a TFT substrate to each other via the sealing resin 11, the vapor-deposited film is never interposed (sandwiched) between the sealing substrate and the TFT substrate at the outer edge of the sealing region.

Accordingly, the sealing resin 11 and the fritted glass can be prevented from having a decreased adhesion and a hole. This allows sealing properties to be fully exhibited, so that the reliability of the organic EL display device 1a can be improved.

Embodiment 3

Next, with reference to FIGS. 10 through 12, a third embodiment of the present invention will be described. The present embodiment is different from Embodiment 1 in that a second electrode is formed after a step of peeling off a masking film 13. Another difference from Embodiment 1 is that an organic layer other than a luminescent layer is also formed by use of a masking film 13 as a mask, without a vapor deposition mask. Still another difference from Embodiment 1 is that the region in a frame shape in which the sealing resin is applied is also covered with the masking film 13, and only the display region R1 is open. Other configurations are the same as those described in Embodiment 1. For easy explanation, the same reference signs will be given to members each having the same function as a member illustrated in the figures of Embodiment 1, and descriptions on such a member will be omitted.

Figure 12:
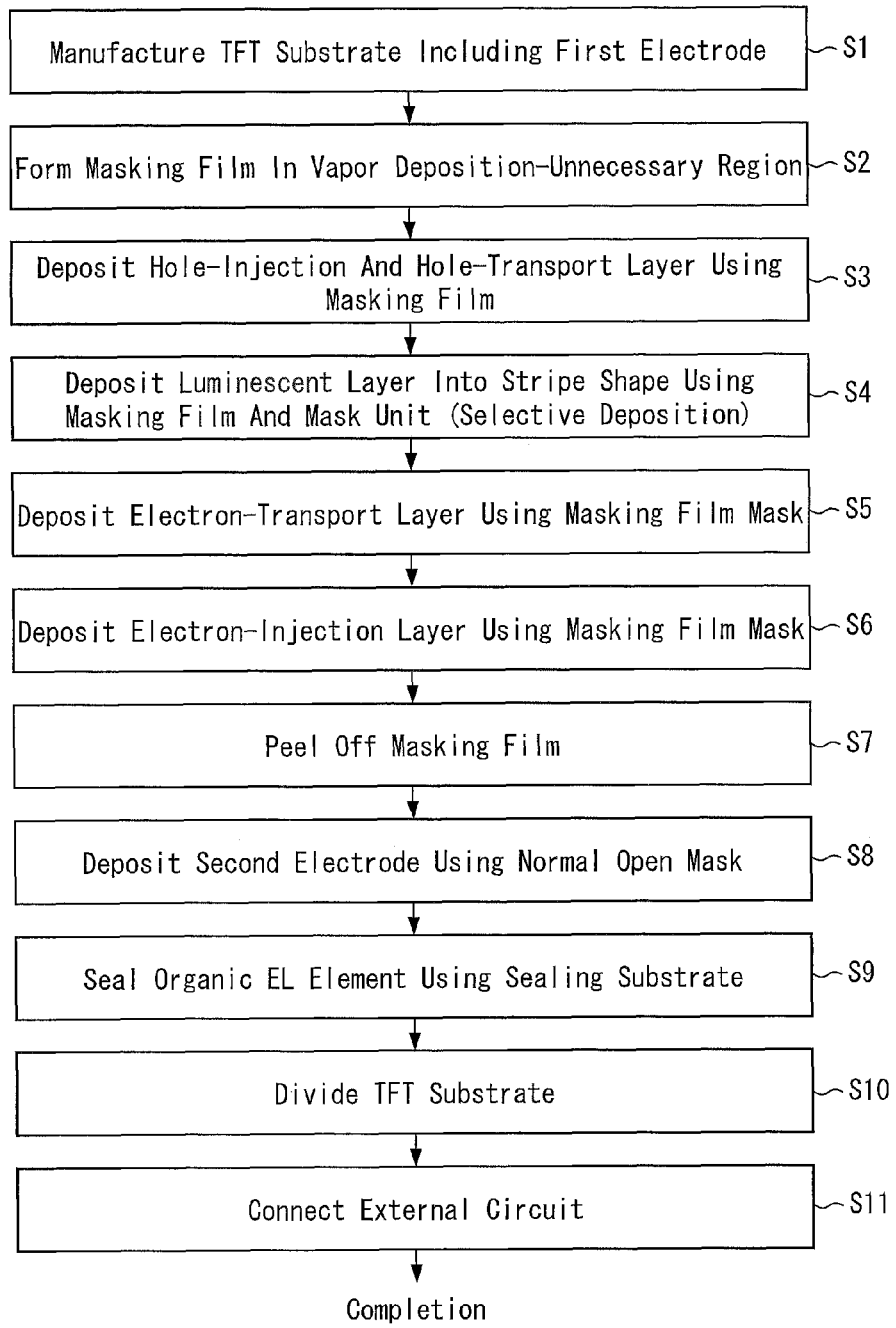
FIG. 12 is a view showing steps of an organic EL display device manufacturing method of Embodiment 3 of the present invention.

FIG. 12 is a view showing an outline of a manufacturing process of an organic EL display device 1b.

Descriptions on steps S1, S2, and S4 in FIG. 12 are omitted since they are the same as the steps S1, S2, and S4 described in FIG. 3 in Embodiment 1. Steps S3, S5 and S6 are similar to the step S7 in FIG. 3 in Embodiment 1. That is, a hole-injection and hole-transport layer, an electron-transport layer, and an electron-injection layer are formed by use of, as a mask, a masking film 13 having an opening only in a display region R1. The masking film 13 covers a second electrode connecting section R3, so that the organic layers are not formed on the second electrode connecting section R3.

Figure 10:
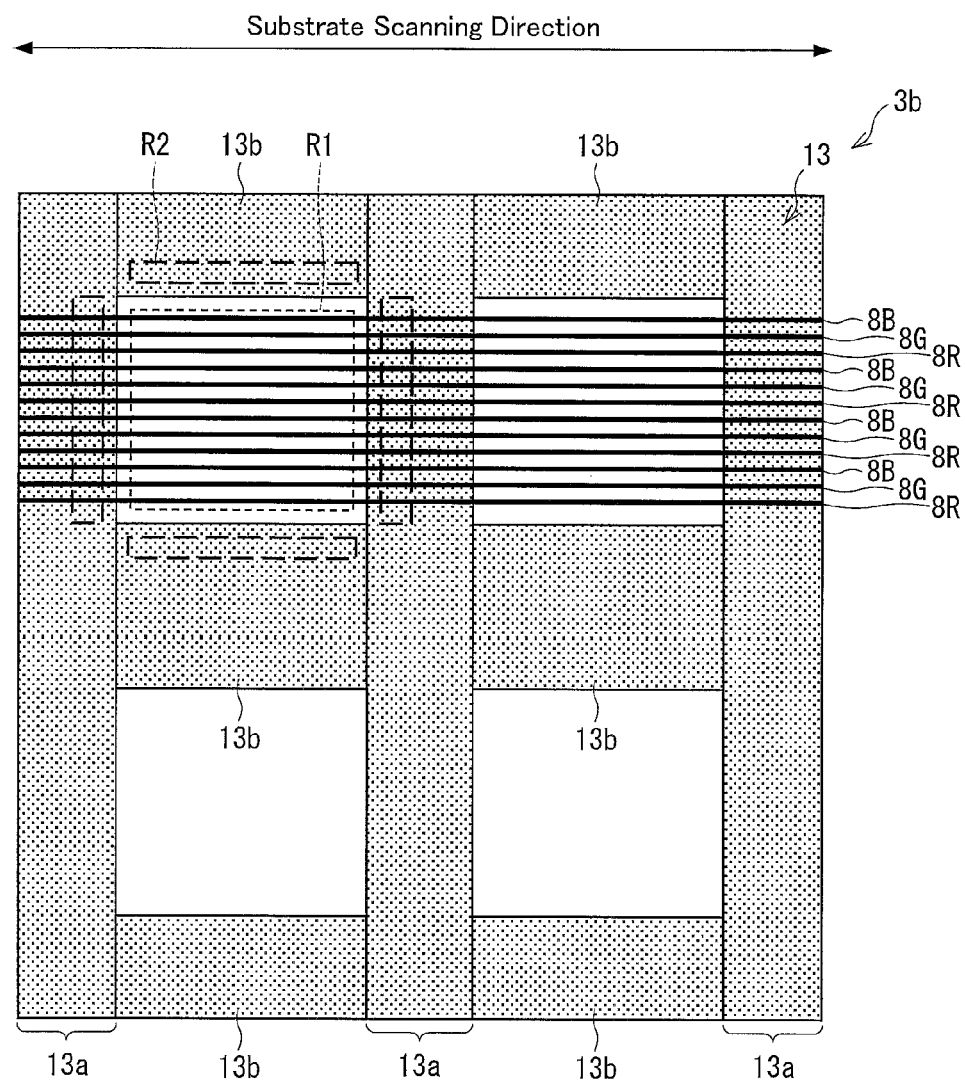
FIG. 10 is a view illustrating (i) a shape of a pattern of a masking film formed on a substrate and (ii) luminescent layers in an organic EL display device manufacturing method of Embodiment 3 of the present invention.

FIG. 10 is a view illustrating (i) a shape of a pattern of the masking film 13 provided on the substrate 3b and (ii) luminescent layers 8R, 8G, and 8B.

As illustrated in FIG. 10, the masking film 13 is formed so as to have an opening in the display region R1.

As such, this process prevents a vapor-deposited film constituting an organic EL element from being damaged.

Then, in the manufacturing process of the present embodiment for manufacturing the organic EL display device 1b, the masking film 13 is peeled off before a second electrode is formed, as shown in FIG. 12 (S7).

Subsequently, the second electrode is deposited by use of a normal open mask, since the masking film 13 has been peeled off (S8).

The substrate 3b, deposition on which is thus completed, is subjected to a sealing process of a sealing region including the display region R1, in order to prevent the organic EL element, which includes a first electrode, a hole-injection and hole-transport layer, the luminescent layers 8R, 8G, and 8B, an electron-transport layer, an electron-injection layer, and the second electrode, from being deteriorated by moisture and oxygen in the atmosphere (S9).

Figure 11:
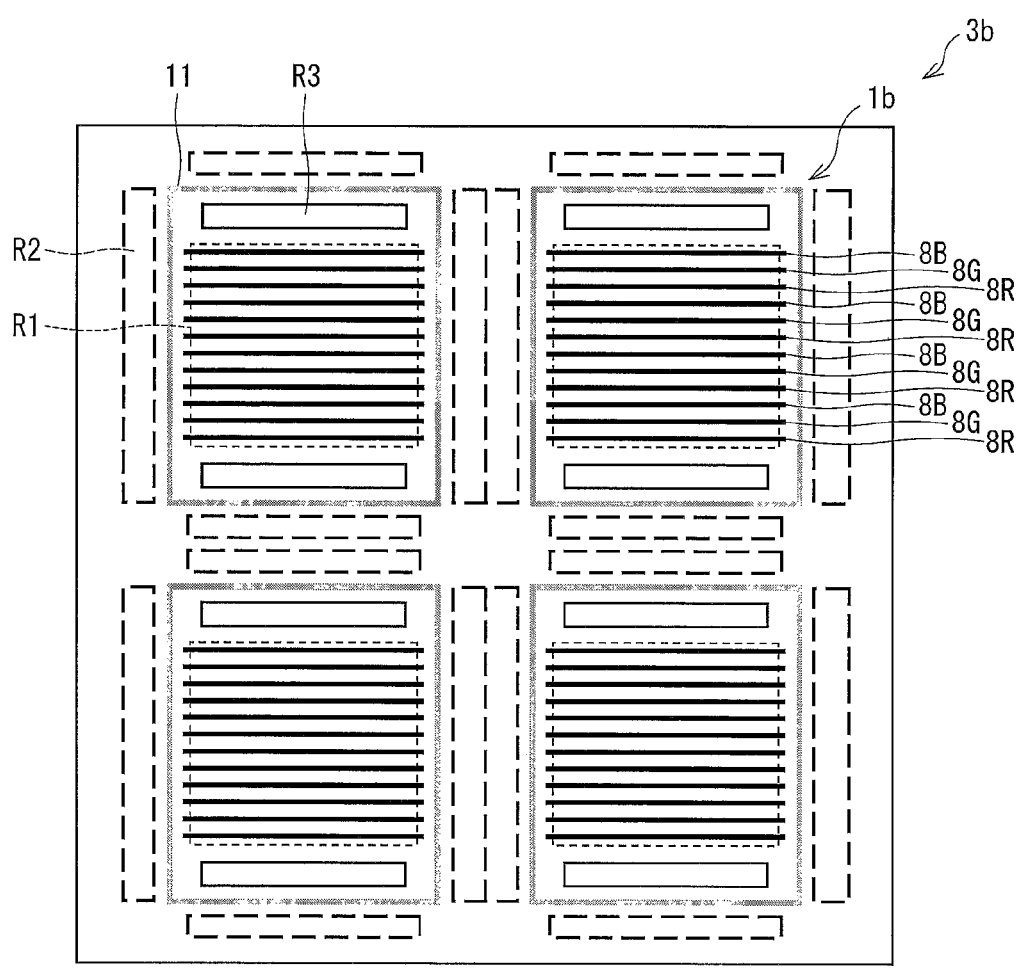
FIG. 11 is a view illustrating a substrate after a step of peeling off a masking film, a step of depositing a second electrode, and a step of sealing a sealing region are carried out in an organic EL display device manufacturing method of Embodiment 3 of the present invention.

FIG. 11 illustrates the substrate 3b in a state after the masking film 13 is peeled off, the second electrode is deposited, and the sealing region including the display region R1 is sealed.

As illustrated in FIG. 11, a sealing resin 11 is formed in a frame shape in end sections at four sides of the sealing region including the display region R1, and the substrate 3b and a sealing substrate (not shown) are attached to each other via the sealing resin 11.

Then, the substrate 3b is divided for each organic EL panel (S10), and a connection with an external circuit (driving circuit) is made by use of a terminal section provided in a vapor deposition-unnecessary region R2 (S12). Thus, the organic EL display device 1b is completed.

In the organic EL display device 1a manufactured in this manner, no vapor-deposited film is formed in the vapor deposition-unnecessary region R2. As such, the problem of formation of a vapor-deposited film in the vapor deposition-unnecessary region R2 is solved easily as Embodiments 1 and 2.

Further, since it is possible to use the masking film 13 as a vapor deposition mask for organic films including the luminescent layers 8R, 8G, and 8B, cycle time of a device can be improved due to a reduction in time for mounting the vapor deposition mask, and a facility cost can be reduced due to a reduction in number of masks. Consequently, the organic EL display device 1b has a reduced cost.

At the same time, due to a reduction in number of times the mask is in close contact with the substrate 3b, it is possible to reduce damage to a surface of organic EL panels. This leads to an improvement in yield of the organic EL display device 1b.

Further, an outer edge (a frame-shaped region in which the sealing resin is provided) of the sealing region, which is a region surrounded by the sealing resin 11, is also included in the vapor deposition-unnecessary region R2 and protected with the masking film 13 (see FIGS. 10 and 11).

As such, in a case where the organic EL element is sealed with the sealing resin 11 and the fritted glass (powdered glass) in a frame shape or in a case where the sealing is carried out by attaching the sealing substrate and a TFT substrate to each other via the sealing resin 11, the vapor-deposited film is never interposed (sandwiched) between the sealing substrate and the TFT substrate at the outer edge of the sealing region.

Accordingly, the sealing resin 11 and the fritted glass can be prevented from having a decreased adhesion and a hole. This allows sealing properties to be fully exhibited, so that the reliability of the organic EL display device 1b can be improved.

Embodiment 4

The present embodiment is obtained by changing, in Embodiment 1, a pattern into which the masking film 13 is formed. In the present embodiment, as illustrated in FIG. 19, a masking film 13 having a belt-like shape is formed on the substrate 3 so as to cover such parts (i.e., (i) terminal section regions R2 that are present on both sides of the display region R1 in a substrate scanning direction and (ii) outer edges on both sides of a sealing region (a region inside the line indicated by the reference numeral 11, and hereinafter referred to as sealing region 11 for easy explanation) in the substrate scanning direction) of a vapor deposition-unnecessary region that are present in a region in which luminescent layers 8R, 8G, and 8B having a stripe shape are formed on the substrate 3.

More specifically, the masking film 13 of the present embodiment is formed (i) at an upstream end and a downstream end of the substrate 3 with respect to the substrate scanning direction and (ii) in a region between each adjacent pair of display regions R1 in the substrate scanning direction, in such a manner that the masking film 13 extends from one end to the other end of the substrate 3 in a direction (hereinafter referred to as scanning perpendicular direction) perpendicular to the substrate scanning direction, so that (i) the display region R1 is exposed by the masking film 13 and (ii) the aforementioned parts of the vapor deposition-unnecessary region on both sides of the display region R1 in the substrate scanning direction are covered with the masking film 13.

Figure 19:
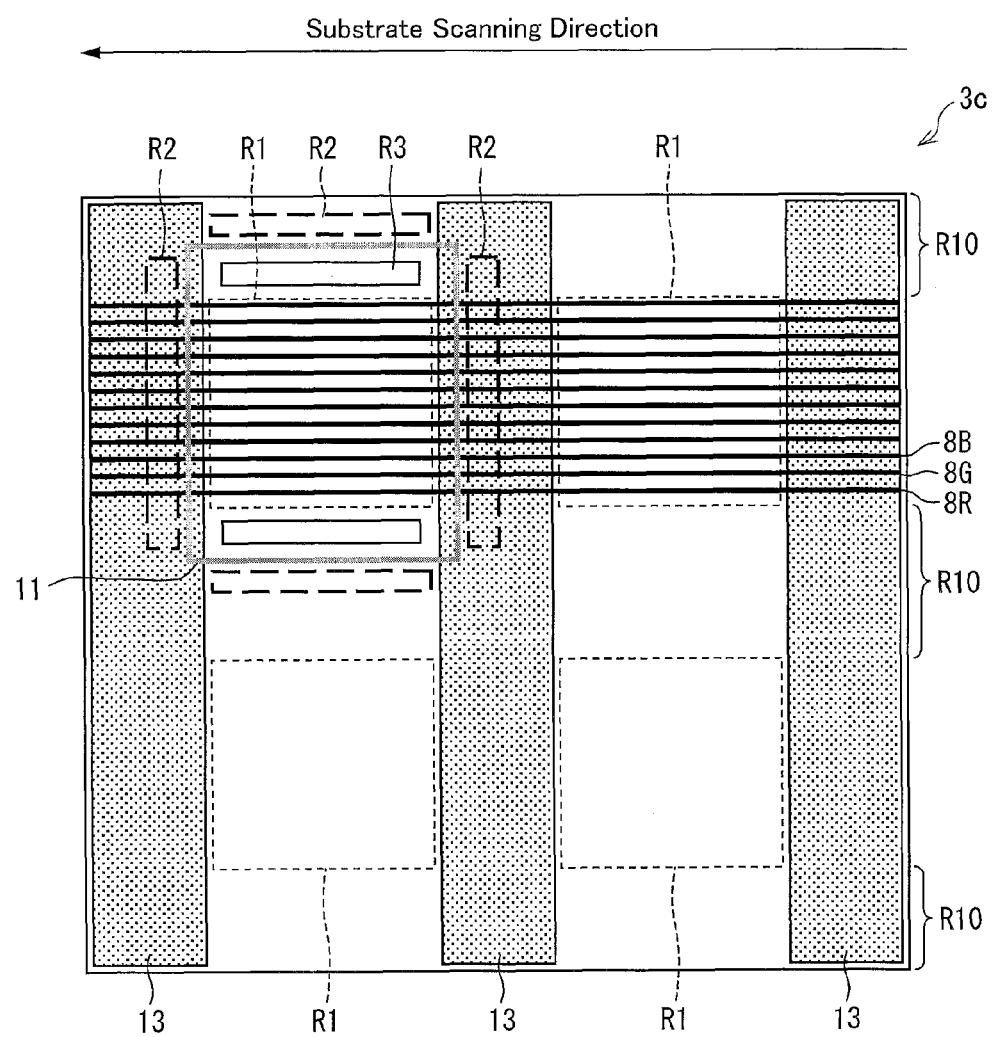
FIG. 19 is a view illustrating a state in which a masking film patterned on a substrate in an organic EL display device manufacturing method of Embodiment 4 of the present invention.

In FIG. 19, terminal section regions R2, second terminal connecting sections R3, and a sealing region 11 are illustrated only with respect to the display region R1 on the upper left of FIG. 19. Note, however, that terminal section regions R2, second terminal connecting sections R3, and a sealing region 11 are set also with respect to each of the other display regions R1 in the same manner.

Figure 20:
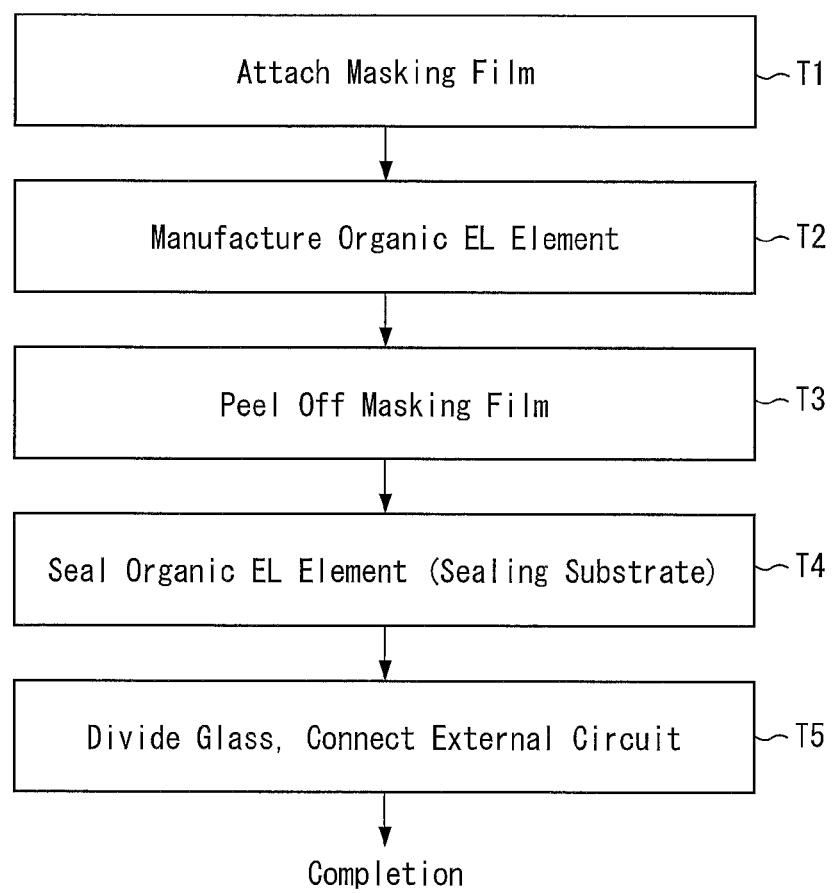
FIG. 20 is a view illustrating steps of organic EL display device manufacturing methods of Embodiments 4 and 5 of the present invention.

In the present embodiment, an organic EL display device 1c is manufactured as shown in FIG. 20.

First, a substrate 3c including a TFT and a first electrode is manufactured in the same manner as Embodiment 1. As illustrated in FIG. 19 (i.e., as described above), the masking film 13 having the band-like shape is formed on the substrate 3c so as to cover such parts (i.e., (i) the terminal section regions R2 that are present on the both sides of the display region R1 in the substrate scanning direction and (ii) the outer edges on the both sides of the sealing region 11 in the substrate scanning direction) of the vapor deposition-unnecessary region that are present in the region in which the luminescent layers 8R, 8G, and 8B having the stripe shape are formed on the substrate 3c (T1).

In this state, an organic EL element is formed on the substrate 3 (T2). That is, in the same manner as Embodiment 1, organic layers (a hole-injection layer, a hole-transport layer, the luminescent layers, an electron-transport layer, and an electron-injection layer) are formed by use of a mask and the masking film 13 by carrying out deposition by means of, for example, substrate scanning.

In this manner, as illustrated in FIG. 19, the luminescent layers 8R, 8G, and 8B having the stripe shape and extending in the substrate scanning direction are formed on the substrate 3c in the display region R1 and on the masking film 13. Note that, although only the luminescent layers 8R, 8G, and 8B that pass through the two display regions R1 on the top are illustrated in FIG. 19, luminescent layers 8R, 8G, and 8B that pass through the two display regions R1 on the bottom are similarly provided as well. Note that no luminescent layers 8R, 8G, and 8B are formed in a region R10 (i.e., regions which are provided on both sides of each display region R1 in the scanning perpendicular direction so as to extend from one end to the other end of the substrate 3c in the substrate scanning direction) in which no luminescent layers 8R, 8G, and 8B need to be formed. Also in forming the second electrode, deposition is carried out by use of an open mask and the masking film 13. The second electrode and a signal wire of the substrate 3 are connected with each other at the second electrode connecting section R3.

After the second electrode is formed, the masking film 13 is peeled off (T3). This causes organic EL elements that are provided in a part other than the display regions R1 to be peeled off together with the masking film 13. Note that the peeling off does not cause damage to organic EL elements that are provided in the display region R1. Then, in a similar manner as Embodiment 1, each of the organic EL elements is sealed by use of a sealing substrate (T4). The substrate 3c is divided for each of the organic EL elements, and then the terminal section regions R2 are electrically connected with an external circuit (T5). Thus, an organic EL display device is completed.

Figure 21:
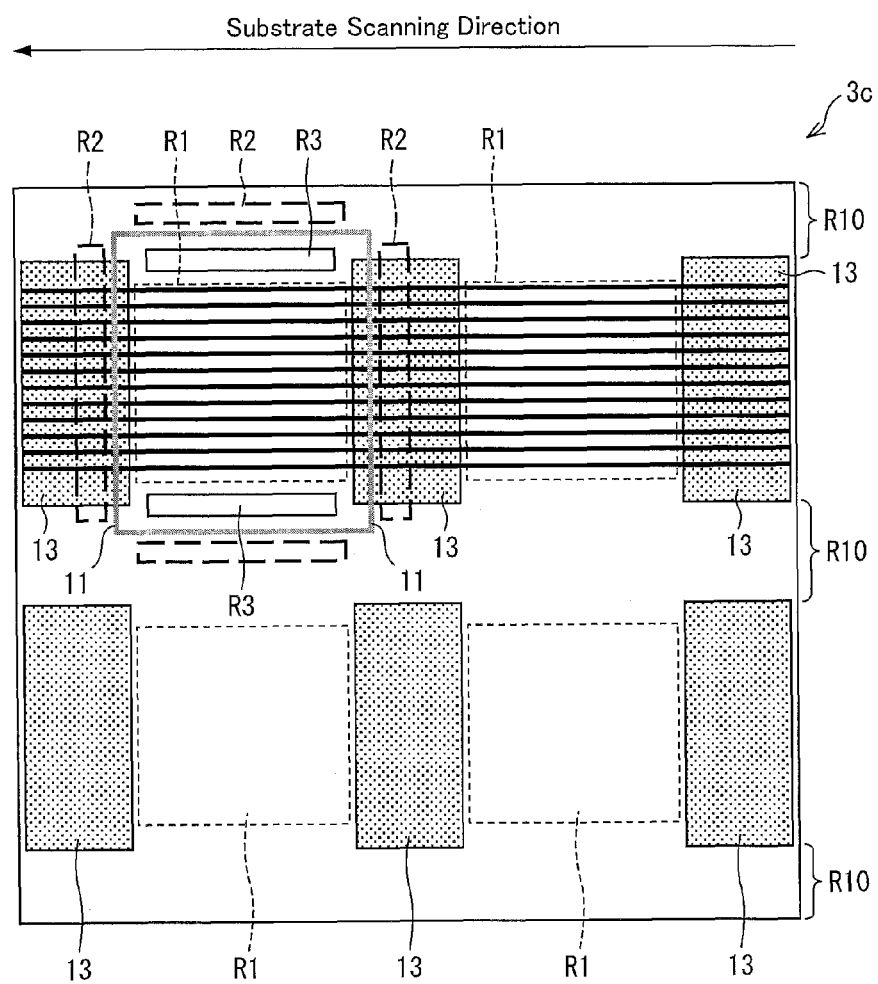
FIG. 21 is a view illustrating an example of a shape of a pattern of a masking film that can be used in an organic EL display device manufacturing method of Embodiment 4 of the present invention.
Figure 22:
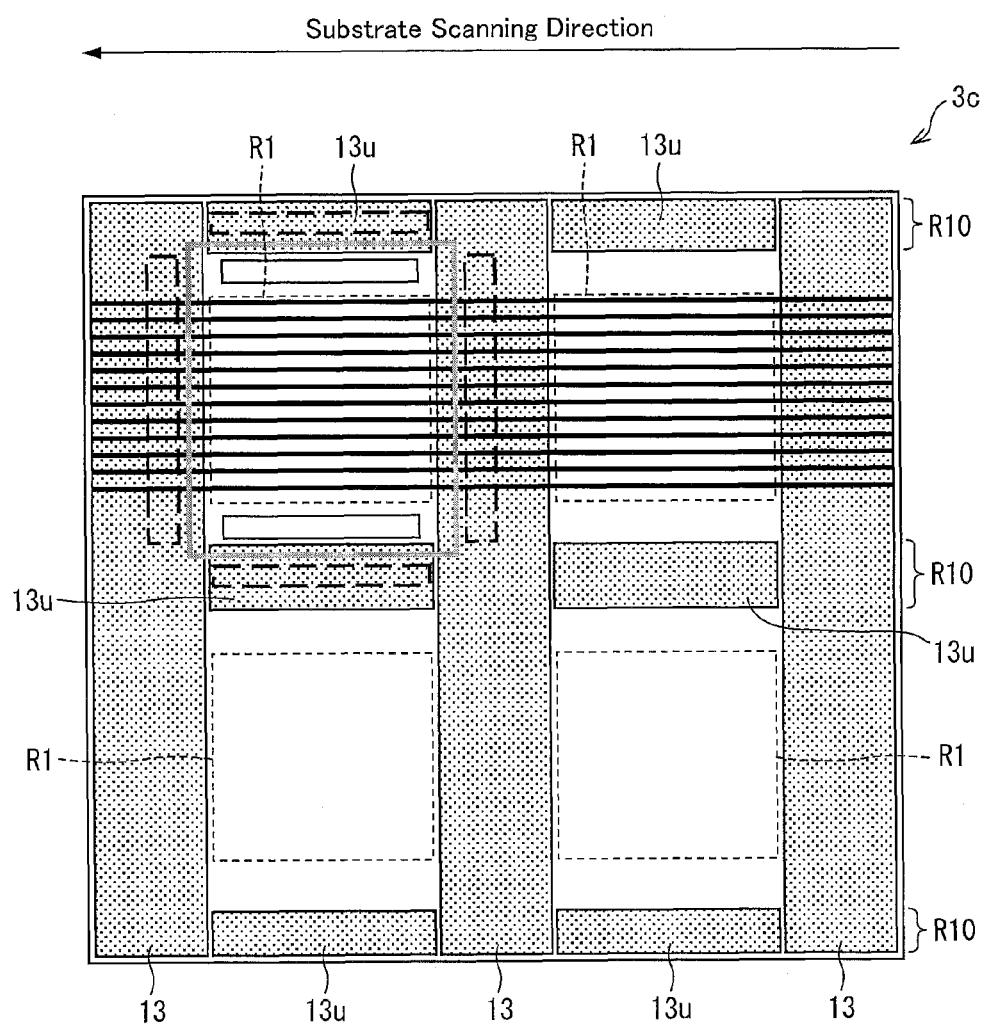
FIG. 22 is a view illustrating another example of a pattern of a masking film that can be used in an organic EL display device manufacturing method of Embodiment 4 of the present invention.

Note that examples of a pattern of the masking film 13 usable in the present embodiment include those illustrated in FIGS. 21 and 22, apart from the one illustrated in FIG. 19.

In FIG. 21, since the masking film 13 does not necessarily have to be formed in the vapor deposition-unnecessary region R10 in which the luminescent layers (vapor-deposited film) 8R, 8G, and 8B having the stripe shape are not formed, the masking film 13 is not formed in the vapor deposition-unnecessary region R10 and is limited to both sides of each of the display regions R1 in the substrate scanning direction. The masking film 13 is formed into the shape of islands which cover (i) terminal section regions R2 that are present on both sides of each of the display regions R1 in the substrate scanning direction and (ii) outer edges on both sides of the sealing region 11.

In FIG. 22, also in vapor deposition-unnecessary regions R10 on both sides of each display region R1 in the scanning perpendicular direction in FIG. 19, a masking film 13$u$ is additionally formed for the purpose of protecting a surface of the substrate 3$c$ and eliminating foreign matters adhered on the surface.

Note that the pattern of the masking film 13 varies depending on the number, arrangement, model, and size of organic EL panels formed on the substrate 3 and therefore an appropriate change of the pattern may be made, accordingly.

As described above, according to the present embodiment, a vapor-deposited film (organic layers such as the luminescent layers 8R, 8G, and 8B) is not formed in the vapor deposition-unnecessary region R2. As such, the problem of formation of a vapor-deposited film in the vapor deposition-unnecessary region R2 is solved easily as Embodiment 1.

Embodiment 5

The present embodiment is obtained by forming, in Embodiment 1, the masking film 13 so that the masking film 13 has an opening identical with that of a vapor deposition mask for the second electrode. This causes the masking film 13 to serve as a replacement of the vapor deposition mask for the second electrode.

Figure 23:
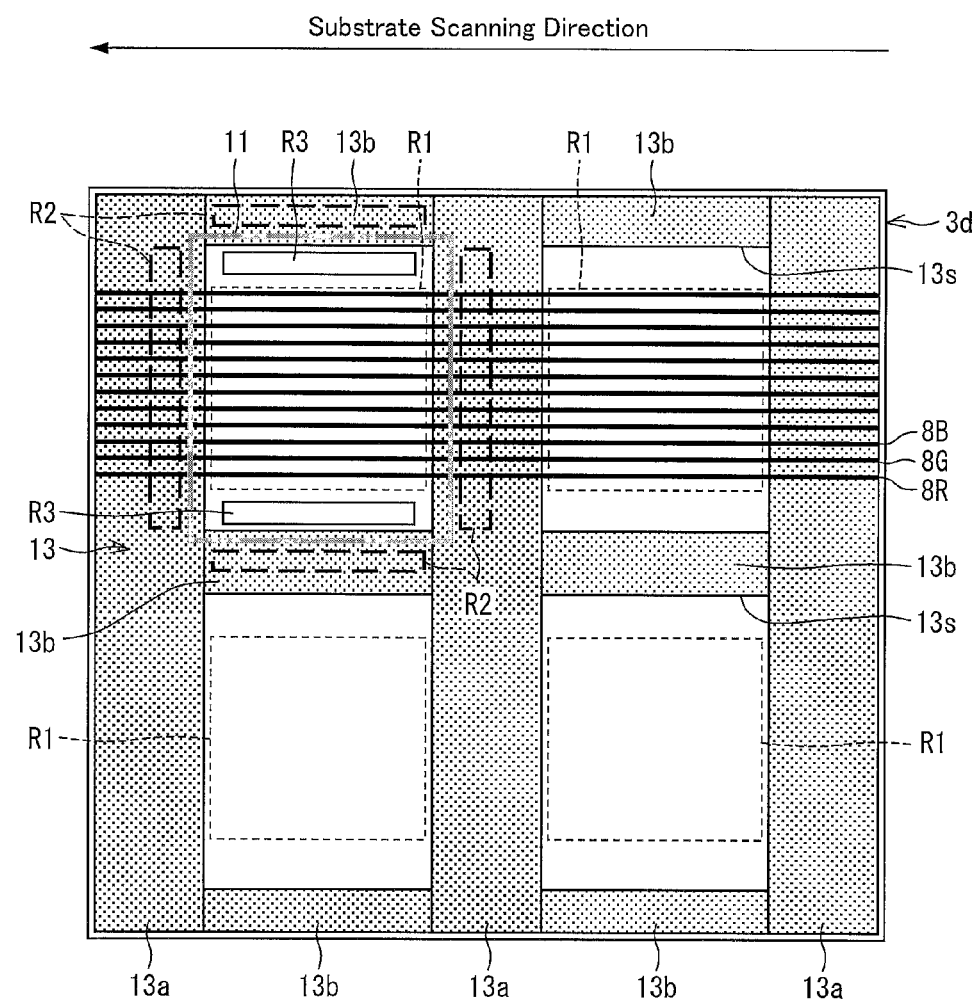
FIG. 23 is a view illustrating a state in which a masking film is patterned on a substrate in an organic EL display device manufacturing method of Embodiment 5 of the present invention.

More specifically, as illustrated in FIG. 23, the masking film 13 has a plurality of openings 13$s$ for the respective display regions R1. The masking film 13 is provided on the substrate 3 so that, in each of the openings 13$s$, (i) only (a) a display region R1 corresponding to the each of the openings 13$s$ and (b) second electrode connecting sections R3 that are present on both sides of the display region R1 in a direction (hereinafter referred to as scanning perpendicular direction) perpendicular to the substrate scanning direction are exposed and (ii) other regions (terminal section regions R2, a periphery of a sealing region 11, and the like) are covered with the masking film 13.

Note that, in the same manner as Embodiment 1, the masking film 13 is constituted by a (i) plurality of long rectangular films 13$a$ which are arranged so as to extend in the scanning perpendicular direction and (ii) a plurality of short rectangular films 13$b$ which are arranged so as to extend in the substrate scanning direction.

In the present embodiment, an organic EL display device 1$d$ is manufactured as shown in FIG. 20.

First, a substrate 3$d$ including a TFT and a first electrode is manufactured in the same manner as Embodiment 1. The masking film 13 having the opening 13$s$ identical with the vapor deposition mask for the second electrode is formed on the substrate 3$d$, as illustrated in FIG. 23 (i.e., as described above) (T1).

In this state, an organic EL element is formed on the substrate 3$d$ (T2). That is, deposition is carried out by substrate scanning in the same manner as in Embodiment 1, so that the luminescent layers 8R, 8G, and 8B having a stripe shape and extending in the substrate scanning direction are formed in the display region R1 of the substrate 3$d$ and on the masking film 13, as illustrated in FIG. 23. In FIG. 22, for convenience in drawing, only the luminescent layers 8R, 8G, and 8B that pass through the two display regions R1 on the top are illustrated. Note, however, that luminescent layers 8R, 8G, and 8B are formed likewise in the two display regions R1 on the bottom. Note that before and after the luminescent layers 8R, 8G, and 8B are formed, a hole-injection layer, a hole-transport layer, an electron-transport layer, and an electron-injection layer are formed over an entire surface of the substrate 3$d$ by deposition by use of an open mask and a masking film. In the present embodiment, since the masking film 13 serves as a mask for the second electrode, the second electrode is formed by deposition without using a mask. The formation of the second electrode causes the second electrode to be connected with a signal wire of the substrate 3 in the second electrode connecting section R3.

Then, after the second electrode is formed, the masking film 13 is peeled off (T3). This causes organic EL elements that are provided in a part other than the display regions R1 to be peeled off and also causes a second electrode provided in an unnecessary region (i.e., a region other than the second electrode connecting section R3 and the display region R1) is peeled off together with the masking film 13. Note that the peeling off does not cause damage to organic elements provided in the display region R1. Then, in a similar manner as Embodiment 1, each of the organic EL elements is sealed by use of a sealing substrate (T4). The substrate 3$d$ is divided for each of the organic EL elements, and then the terminal section region R2 is electrically connected with an external circuit (T5). Thus, an organic EL display device is completed.

As described above, according to the present embodiment, a vapor-deposited film is not formed in the vapor deposition-unnecessary region R2. As such, the problem of formation of a vapor-deposited film in the vapor deposition-unnecessary region R2 is solved easily.

Further, since the masking film 13 also serves as a vapor deposition mask for the second electrode, cycle time of a device can be improved due to a reduction in time for mounting the vapor deposition mask, and a facility cost can be reduced due to a reduction in number of masks. Consequently, the organic EL display device has a reduced cost. At the same time, due to a reduction in number of times the mask is in close contact with the substrate, it is possible to reduce damage to a surface of organic EL panels. This leads to an improvement in yield of the organic EL display device. Note that the second electrode can be formed not only by deposition but also by other film forming methods such as sputtering.

Further, in the present embodiment, the masking film 13 can be used not only as a mask for the second electrode but also as a mask for a sealing film. In this case, the sealing film is formed into the same shape as that of the second electrode.

Further, an outer edge of the sealing region 11 is also included in the vapor deposition-unnecessary region and protected with the masking film 13. As such, in a case where the organic EL element is sealed with the sealing resin and the fritted glass in a frame shape or in a case where the sealing is carried out by attaching the sealing substrate and a TFT substrate to each other via resin, the vapor-deposited film is never interposed (sandwiched) between the substrates 3 at the outer edge of the sealing region R4. Accordingly, the resin and the fritted glass can be prevented from having a decreased adhesion and a hole. This allows sealing properties to be fully exhibited, so that the reliability of the organic EL display device can be improved.

Modified Example

Embodiments 1 through 5 have been described as cases, as examples, in which the masking film 13 has adhesiveness or tackiness and is bonded to the substrates 3, 3$a$, 3$b$, 3$c$, 3$d$, and 3$e$ by means of the adhesiveness or the tackiness. Note, however, that the present invention is not limited to these cases. For example, it is possible to employ a method in which a resin film without a surface having adhesiveness is used as the masking film 13 so as to be fusion-bonded to a substrate by laser or the like and then peeled off mechanically or by laser irradiation or the like (heat treatment). In this case, by fusion-bonding the resin film on several spots in a non-pattern region on the substrate, it is possible to prevent damage to a pattern on the substrate. Further, the masking film 13 can be constituted by a thermal adhesive film or the like.

Note that the present invention is applicable not only to manufacture of an organic EL display device but also to any other purposes that involves deposition by means of scanning.

Embodiments 1 through 5 have been described based on cases in which organic layers (particularly a luminescent layer) are formed by use of the masking film 13 as a mask. Note, however, that a metal layer such as a wire may be formed by use of the masking film 13 as a mask. Further, it is possible to use an inorganic layer instead of an organic layer. In this case, the inorganic layer may be formed by use of the masking film 13 as a mask.

[Outline]

As described above, in order to attain the object, a vapor-deposited film forming method in accordance with an embodiment of the present invention is a method for forming a vapor-deposited film on a substrate, including the steps of: forming, in a predetermined region of the substrate, a shielding film that can be peeled off; forming a vapor-deposited film on the substrate via the shielding film; and forming the vapor-deposited film into a predetermined shape by peeling off the shielding film.

According to the method, after a shielding film that can be peeled off is formed in a predetermined region of the substrate, a high-resolution vapor-deposited film is relatively easily formed on the substrate via the shielding film, and then the shielding film is peeled off, so that the vapor-deposited film can be patterned into a predetermined shape with high resolution.

Therefore, the method enables high-resolution patterning.

Further, since the shielding film is peeled off after the vapor-deposited film is formed on the substrate via the shielding film, it is possible to prevent the vapor-deposited film from being formed in a region in which the shielding film is provided.

The vapor-deposited film forming method in accordance with an embodiment of the present invention is preferably arranged such that the shielding film is constituted by a plurality of film members which are arranged in such a manner that the plurality of film members are allowed to overlap each other.

According to the method, since the shielding film is constituted by the plurality of film members which are arranged in such a manner that the plurality of film members are allowed to overlap each other, (i) the shielding film is easily formed on the substrate and (ii) a pattern of the shielding film is easily made to correspond to various patterns.

The vapor-deposited film forming method in accordance with an embodiment of the present invention is preferably arranged such that the shielding film has a surface having adhesiveness or tackiness.

According to the method, since the shielding film has the surface having adhesiveness or tackiness, it is possible to form the shielding film on the substrate by merely attaching the surface on the substrate. It is also possible to peel off the shielding film easily. Further, at the time of peeling off the shielding film, dust that has been adhered to the substrate before the formation of the shielding film can be eliminated together with the shielding film which is peeled off.

The vapor-deposited film forming method in accordance with an embodiment of the present invention is preferably arranged such that the shielding film is constituted by a resin film not having a surface having adhesiveness and be attached to the substrate by heat-sealing.

According to the method, the shielding film is formed on the substrate by heat-sealing, it is possible to utilize the resin film, which does not have a surface having adhesiveness, as the shielding film. Further, since no adhesiveness is used, it is possible to prevent an adhesive from remaining on the substrate as remnants when the shielding film is peeled off.

The vapor-deposited film forming method in accordance with an embodiment of the present invention is preferably arranged such that the shielding film is peeled off the substrate by a heat treatment.

According to the method, since the shielding film is peeled off by the heat treatment, it is possible to peel off the shielding film easily.

The vapor-deposited film forming method in accordance with an embodiment of the present invention is preferably arranged such that the shielding film is formed so as to cover a terminal section region on the substrate, the terminal section region being connected with an external circuit.

According to the method, the shielding film is formed so as to cover the terminal section region on the substrate, the terminal section region being connected with the external circuit. This makes it possible to prevent the vapor-deposited film from being formed in the terminal section region. Accordingly, a good electrical connection between the terminal section and the external circuit is obtained.

The vapor-deposited film forming method in accordance with an embodiment of the present invention is preferably arranged such that the vapor-deposited film has a shape of a plurality of straight lines having a predetermined gap between each other and is formed along a predetermined direction.

According to the method, the vapor-deposited film has the shape of a plurality of straight lines having a predetermined gap between each other and is formed along the predetermined direction. This makes it possible to pattern the vapor-deposited film into a predetermined shape with high resolution.

It is preferable that the vapor-deposited film forming method in accordance with an embodiment of the present invention further include the step of: forming, by use of a mask having a through-hole, a second film which is different from the vapor-deposited film, the step of forming the second film being carried out before, after, or before and after the step of forming the vapor-deposited film on the substrate, the peeling off of the shielding film being carried out after the step of forming the second film.

According to the method, since the shielding film can be used as a vapor deposition mask in a step after the shielding film is formed, deposition can be carried out without a mask. Accordingly, cycle time of a device can be improved due to a reduction in time for mounting the vapor deposition mask, and a facility cost can be reduced.

At the same time, due to a reduction in number of times the mask is in close contact with the substrate 3a, it is possible to reduce damage to a surface of the substrate.

It is preferable that the vapor-deposited film forming method in accordance with an embodiment of the present invention further include the step of: forming, by use of a mask having a through-hole, a second film which is different from the vapor-deposited film, the step of forming the second film being carried out before, after, or before and after the step of forming the vapor-deposited film on the substrate, the peeling off of the shielding film being carried out after the step of forming the second film.

According to the method, since the mask having the through-hole and the substrate are in close contact with each other via the shielding film, the shielding film serves as a protection film for the substrate. This makes it possible to reduce damage to the surface of the substrate.

The vapor-deposited film forming method in accordance with an embodiment of the present invention is preferably arranged such that: in the step of forming the vapor-deposited film on the substrate, (i) a constant distance is maintained between a vapor deposition mask in a mask unit and the substrate, the mask unit including (a) the vapor deposition mask, which has a through-hole and an area smaller than that of the substrate and (b) an injection port, from which deposition particles supplied from a vapor deposition material supply source are injected, via the vapor deposition mask, to a surface of the substrate on which surface the shielding film has been formed, a relative position between the vapor deposition mask and the injection port being fixed; and (ii) at least one of the mask unit and the substrate is scanned over the other, so that the vapor-deposited film is formed.

According to the method, it is possible to form, with efficiency and high resolution, the vapor-deposited film having the shape of a plurality of straight lines having a predetermined gap between each other.

The vapor-deposited film forming method in accordance with an embodiment of the present invention may be arranged such that: the vapor deposition mask in the mask unit is in close contact with the substrate.

According to the method, the substrate and the vapor deposition mask are in close contact with each other via the shielding film. This makes it possible to prevent, by means of the shielding film, the vapor deposition mask from giving damage to the substrate.

In order to attain the object, a display device manufacturing method in accordance with an embodiment of the present invention is a method for manufacturing a display device, including the steps of: forming a plurality of active elements on a substrate; forming a first electrode in matrix in a display region on the substrate so that the first electrode is electrically connected with each of the plurality of active elements; forming, on the first electrode, an organic layer including at least a luminescent layer; and forming, at least on the organic layer, a second electrode having a reverse polarity to that of the first electrode, wherein: in a step of forming at least the luminescent layer in the organic layer, (i) a shielding film which can be peeled off is formed so as not to cover the display region but cover at least a part of a non-display region, which is a peripheral region of the display region and (ii) at least the luminescent layer, which has a shape of a plurality of straight lines having a predetermined gap between each other, is formed on the substrate via the shielding film so as to extend along a row direction or a column direction of the first electrode formed in matrix; and after the step of forming at least the luminescent layer in the organic layer or after the step of forming the second electrode, the shielding film is peeled off, so that at least the luminescent layer is formed into a predetermined shape.

According to the method, it is possible to realize a method for manufacturing a display device having an improved yield and an improved reliability.

The display device manufacturing method in accordance with an embodiment of the present invention is preferably arranged such that the step of forming the organic layer including at least the luminescent layer includes a step of forming, by use of the shielding film as a mask, (i) a layer in the organic layer other than the luminescent layer, (ii) a metal layer, or (iii) an inorganic layer.

According to the method, since the shielding film can be used as a vapor deposition mask in a step after the shielding film is formed, deposition can be carried out without a mask. Accordingly, cycle time of a device can be improved due to a reduction in time for mounting the vapor deposition mask, and a facility cost can be reduced.

At the same time, due to a reduction in number of times the mask is in close contact with the substrate, it is possible to reduce damage to a surface of the substrate.

Therefore, the method enables improvements in yield and reliability and a reduction in manufacturing cost.

The display device manufacturing method in accordance with an embodiment of the present invention is preferably arranged such that the step of forming the organic layer including at least the luminescent layer includes a step of forming, by use of a mask having a through-hole, (i) a layer in the organic layer other than the luminescent layer, (ii) a metal layer, or (iii) an inorganic layer.

According to the method, since the mask having the through-hole and the substrate are in close contact with each other via the shielding film, the shielding film serves as a protection film for the substrate. Accordingly, damage to the surface of the substrate can be reduced. This makes it possible to realize a method for manufacturing a display device having an improved yield and an improved reliability.

The display device manufacturing method in accordance with an embodiment of the present invention is preferably arranged such that the peeling off of the shielding film is carried out after the step of forming the second electrode; and in the step of forming the second electrode, the second electrode is formed by use of the shielding film as a mask.

According to the method, since the shielding film can be used as a mask in the step of forming the second electrode, the step of forming the second electrode can be carried out without a mask. Accordingly, cycle time of a device can be improved due to a reduction in time for mounting a mask, and a facility cost can be reduced.

At the same time, due to a reduction in number of times the mask is in close contact with the substrate, it is possible to reduce damage to the surface of the substrate.

The display device manufacturing method in accordance with an embodiment of the present invention is preferably arranged such that, in the step of forming the second electrode, the second electrode is formed by use of a mask having a through-hole.

The display device manufacturing method in accordance with an embodiment of the present invention is preferably arranged such that the shielding film is peeled off after the step of forming at least the luminescent layer in the organic layer and before the step of forming the second electrode.

According to the method, it is possible to peel off the shielding film after the step of forming at least the luminescent layer.

It is preferable that the display device manufacturing method in accordance with an embodiment of the present invention further include the step of: sealing, in the display region, the first electrode, the organic layer, and the second electrode by use of a sealing member, the step of sealing by use of the sealing member being carried out before forming at least the luminescent layer into the predetermined shape by peeling off the shielding film.

According to the method, the shielding film is peeled off in a state where the first electrode, the organic layer, and the second electrode are sealed by use of the sealing member. This makes it possible to suppress an effect of the peeling off of the shielding film.

It is preferable that the display device manufacturing method in accordance with an embodiment of the present invention further include the steps of: forming a sealing film for sealing, in the display region, the first electrode, the organic layer, and the second electrode by use of the shielding film as a mask, the step of forming the sealing film being carried out before forming at least the luminescent layer into the predetermined shape by peeling off the shielding film; and sealing, in the display region, the first electrode, the organic layer, the second electrode, and the sealing film by use of a sealing member after forming at least the luminescent layer into the predetermined shape by peeling off the shielding film.

According to the method, the shielding film is peeled off in a state where the first electrode, the organic layer, and the second electrode are sealed by use of the sealing member. This makes it possible to suppress an effect of the peeling off of the shielding film.

Further, since sealing by use of the sealing member is also carried out separately from the sealing by use of the sealing film, reliability can be improved.

It is preferable that the display device manufacturing method in accordance with an embodiment of the present invention further include the steps of: sealing, in the display region, the first electrode, the organic layer, and the second electrode by use of a sealing member, the step of sealing by use of the sealing member being carried out after the step of forming the second electrode.

The display device manufacturing method in accordance with an embodiment of the present invention is preferably arranged such that, when at least the luminescent layer, which has the shape of the plurality of straight lines having the predetermined gap between each other, is formed on the opening and the pattern film so as to extend along the row direction or the column direction of first electrode formed in matrix, (i) a constant distance is maintained between a vapor deposition mask in a mask unit and the substrate, the mask unit including (a) the vapor deposition mask, which has a through-hole and an area smaller than that of the substrate and (b) an injection port, from which deposition particles supplied from a vapor deposition material supply source are injected, via the vapor deposition mask, to a surface of the substrate on which surface the shielding film has been formed, a relative position between the vapor deposition mask and the injection port being fixed; and (ii) at least one of the mask unit and the substrate is scanned over the other, so that at least the luminescent layer is formed.

According to the method, it is possible to realize a method for manufacturing a display device having an improved yield and an improved reliability.

The display device manufacturing method in accordance with an embodiment of the present invention may be arranged such that the vapor deposition mask in the mask unit and the substrate are in close contact with each other.

According to the method, the substrate and the vapor deposition mask are in close contact with each other via the shielding film. This makes it possible to prevent, by means of the shielding film, the vapor deposition mask from giving damage to the substrate.

The present invention is not limited to the above-described embodiments but allows various modifications within the scope of the claims. Any embodiment obtained by appropriately combining the technical means disclosed in the different embodiments will also be included in the technical scope of the present invention.

INDUSTRIAL APPLICABILITY

The present invention can be suitably applied to, for example, a manufacturing process of an organic EL display device.

REFERENCE SIGNS LIST

1, 1a, 1b, 1c, and 1d: organic EL display device (display device)
2: TFT (active element)
3, 3a, 3b, 3c, and 3d: substrate
5: first electrode
7: hole-injection layer and hole-transport layer (organic layer)
8R, 8G, and 8B: luminescent layer
9: second electrode
10: organic EL element
11: sealing resin (sealing member)
12: sealing substrate (sealing member)
13: masking film (shielding film)
R1: display region
R2: vapor deposition-unnecessary region (terminal section region) (non-display region)
R3: second electrode connecting section

The invention claimed is:

1. A method for forming a vapor-deposited film on a substrate, comprising the steps of:
    forming, in a predetermined region of the substrate, a shielding film that can be peeled off;
    forming a vapor-deposited film on the substrate via the shielding film;
    forming the vapor-deposited film into a predetermined shape by peeling off the shielding film; and
    forming, by use of a vapor deposition mask having a through-hole, a second film which is different from the vapor-deposited film, the step of forming the second film being carried out before, after, or before and after the step of forming the vapor-deposited film on the substrate, the shielding film having an opening that corresponds to a region on the substrate other than the predetermined region, the through-hole being smaller than the opening of the shielding film, and the second film and the vapor-deposited film overlapping each other in the opening of the shielding film when viewed from above, the peeling off of the shielding film being carried out after the step of forming the second film, wherein
    the second film formed on a surface of the shielding film and the vapor-deposited film formed on the surface of the shielding film are peeled off together.

2. The method as set forth in claim 1, wherein:
    in the step of forming the second film on the substrate,
    (i) a constant distance is maintained between the vapor deposition mask in a mask unit and the substrate, the mask unit including (a) the vapor deposition mask, which has an area smaller than that of the substrate and (b) an injection port, from which deposition particles supplied from a vapor deposition material supply source are injected, via the vapor deposition mask, to a surface of the substrate on which surface the shielding film has been formed, a relative position between the vapor deposition mask and the injection port being fixed; and (ii) at least one of the mask unit and the substrate is scanned over the other, so that the second film is formed.

3. The method as set forth in claim 2, wherein:
the vapor deposition mask in the mask unit is in close contact with the substrate.

4. A method as set forth in claim 1, further comprising the step of:
forming, by use of the shielding film as a mask, a first film which is different from the vapor-deposited film, the step of forming the first film being carried out before, after, or before and after the step of forming the vapor-deposited film on the substrate,
the peeling off of the shielding film being carried out after the step of forming the first film.

5. The method as set forth in claim 1, wherein:
the shielding film is constituted by a plurality of film members which are arranged in such a manner that the plurality of film members are allowed to overlap each other.

6. The method as set forth in claim 1, wherein:
the shielding film has a surface having adhesiveness or tackiness.

7. The method as set forth in claim 1, wherein:
the shielding film is constituted by a resin film not having a surface having adhesiveness and is attached to the substrate by heat-sealing.

8. The method as set forth in claim 7, wherein:
the shielding film is peeled off the substrate by a heat treatment.

9. The method as set forth in claim 1, wherein:
the shielding film is formed so as to cover a terminal section region on the substrate, the terminal section region being connected with an external circuit.

10. The method as set forth in claim 1, wherein:
the vapor-deposited film has a shape of a plurality of straight lines having a predetermined gap between each other and is formed along a predetermined direction.

11. The method as set forth in claim 1, wherein:
the second film has an area smaller than that of the vapor-deposited film when viewed from above; and
the second film has a stripe shape in the opening of the shielding film.

12. A method for manufacturing a display device, comprising the steps of:
forming a plurality of active elements on a substrate;
forming a first electrode in matrix in a display region on the substrate so that the first electrode is electrically connected with each of the plurality of active elements;
forming, on the first electrode, an organic layer including at least a luminescent layer; and
forming, at least on the organic layer, a second electrode having a reverse polarity to that of the first electrode, wherein:
in a step of forming at least the luminescent layer in the organic layer,
(i) a shielding film which can be peeled off is formed so as not to cover the display region but cover at least a part of a non-display region, which is a peripheral region of the display region and
(ii) at least the luminescent layer, which has a shape of a plurality of straight lines having a predetermined gap between each other, is formed on the substrate via the shielding film so as to extend along a row direction or a column direction of the first electrode formed in matrix;
after the step of forming at least the luminescent layer in the organic layer or after the step of forming the second electrode,
the shielding film is peeled off, so that at least the luminescent layer is formed into a predetermined shape; and
the step of forming the organic layer including at least the luminescent layer includes a step of forming, by use of a mask having a through-hole which is smaller than an opening of the shielding film, (i) a layer in the organic layer other than the luminescent layer, (ii) a metal layer or (iii) an inorganic layer, the organic layer and the luminescent layer overlapping each other in the opening of the shielding film when viewed from above.

13. The method as set forth in claim 12, wherein:
the step of forming the organic layer including at least the luminescent layer includes a step of forming, by use of the shielding film as a mask, (i) a layer in the organic layer other than the luminescent layer, (ii) a metal layer or (iii) an inorganic layer.

14. The method as set forth in claim 12, wherein:
the peeling off of the shielding film is carried out after the step of forming the second electrode; and
in the step of forming the second electrode, the second electrode is formed by use of the shielding film as a mask.

15. The method as set forth in claim 12, wherein:
in the step of forming the second electrode, the second electrode is formed by use of a mask having a through-hole.

16. The method as set forth in claim 15, wherein:
the shielding film is peeled off after the step of forming at least the luminescent layer in the organic layer and before the step of forming the second electrode.

17. A method as set forth in claim 16, further comprising the step of:
sealing, in the display region, the first electrode, the organic layer, and the second electrode by use of a sealing member,
the step of sealing by use of the sealing member being carried out after the step of forming the second electrode.

18. A method as set forth in claim 12, further comprising the step of:
sealing, in the display region, the first electrode, the organic layer, and the second electrode by use of a sealing member,
the step of sealing by use of the sealing member being carried out before forming at least the luminescent layer into the predetermined shape by peeling off the shielding film.

19. A method as set forth in claim 12, further comprising the steps of:
forming a sealing film for sealing, in the display region, the first electrode, the organic layer, and the second electrode by use of the shielding film as a mask, the step of forming the sealing film being carried out before forming at least the luminescent layer into the predetermined shape by peeling off the shielding film; and
sealing, in the display region, the first electrode, the organic layer, the second electrode, and the sealing film by use of a sealing member after forming at least the luminescent layer into the predetermined shape by peeling off the shielding film.

20. The method as set forth in claim 12, wherein:
when at least the luminescent layer, which has the shape of the plurality of straight lines having the predetermined gap between each other, is formed on the substrate so as to extend along the row direction or the column direction of first electrode formed in matrix, (i) a constant distance is maintained between a vapor deposition mask in a mask unit and the substrate, the mask unit including (a) the vapor deposition mask, which has a through-hole and an area smaller than that of the substrate and (b) an injection port, from which deposition particles supplied from a vapor deposition material supply source are injected, via the vapor deposition mask, to a surface of the substrate on which surface the shielding film has been formed, a relative position between the vapor deposition mask and the injection port being fixed; and (ii) at least one of the mask unit and the substrate is scanned over the other, so that at least the luminescent layer is formed.

\* \* \* \* \*